(12) United States Patent
Disney

(10) Patent No.: US 6,768,171 B2
(45) Date of Patent: Jul. 27, 2004

(54) HIGH-VOLTAGE TRANSISTOR WITH JFET CONDUCTION CHANNELS

(75) Inventor: Donald Ray Disney, Cupertino, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 10/137,762

(22) Filed: May 2, 2002

(65) Prior Publication Data

US 2002/0132406 A1 Sep. 19, 2002

Related U.S. Application Data

(63) Continuation-in-part of application No. 09/723,957, filed on Nov. 27, 2000, now Pat. No. 6,468,847.

(51) Int. Cl.[7] .............................................. H01L 29/76
(52) U.S. Cl. ........................ 257/342; 257/343; 257/262
(58) Field of Search ........................................ 257/262

(56) References Cited

U.S. PATENT DOCUMENTS

| | | | |
|---|---|---|---|
| 4,618,541 A | 10/1986 | Forouhi et al. |
| 4,626,879 A | 12/1986 | Colak |
| 4,665,426 A | 5/1987 | Allen et al. |
| 4,738,936 A | 4/1988 | Rice |
| 4,754,310 A | 6/1988 | Coe |
| 4,764,800 A | 8/1988 | Sander |
| 4,811,075 A | 3/1989 | Elkund |
| 4,890,146 A | 12/1989 | Williams et al. |
| 4,922,327 A | 5/1990 | Mena et al. |
| 4,926,074 A | 5/1990 | Singer et al. |
| 4,939,566 A | 7/1990 | Singer et al. |
| 4,963,951 A | 10/1990 | Adler et al. |
| 4,967,246 A | 10/1990 | Tanaka |
| 5,010,024 A | 4/1991 | Allen et al. |
| 5,025,296 A | 6/1991 | Fullerton et al. |
| 5,040,045 A | 8/1991 | McArthur et al. |
| 5,068,700 A | 11/1991 | Yamaguchi et al. |
| 5,146,298 A | 9/1992 | Eklund |
| 5,155,574 A | 10/1992 | Yamaguchi |

(List continued on next page.)

FOREIGN PATENT DOCUMENTS

| | | |
|---|---|---|
| DE | 43 09 764 | 9/1994 |
| EP | 1 073 123 A2 | 7/2000 |
| GB | 2 309 336 A | 1/1997 |
| JP | 56-38867 | 4/1981 |
| JP | 57-10975 | 1/1982 |
| JP | 57-12557 | 1/1982 |
| JP | 57-12558 | 1/1982 |
| JP | 60-64471 | 4/1985 |
| JP | 3-211771 | 9/1991 |

(List continued on next page.)

OTHER PUBLICATIONS

Fujihira, "Theory of Semiconductor Superjunction Devices," Jpn. J. Appl. Phys., vol. 36, pp. 6254–6262 (Oct. 1997).

(List continued on next page.)

*Primary Examiner*—Mark V. Prenty
(74) *Attorney, Agent, or Firm*—Burgess & Bereznak, LLP

(57) ABSTRACT

A high voltage insulated gate field-effect transistor with multiple JFET conduction channels comprises a first buried layer disposed in a first epitaxial layer formed on a substrate, a second buried layer disposed in a second epitaxial layer formed on the first epitaxial layer, with the first and second buried layers being spaced vertically apart in a substantially parallel configuration such that a JFET conduction channel of the first conductivity type is formed between the first and second buried layers. It is emphasized that this abstract is provided to comply with the rules requiring an abstract that will allow a searcher or other reader to quickly ascertain the subject matter of the technical disclosure. It is submitted with the understanding that it will not be used to interpret or limit the scope or meaning of the claims. 37 CFR 1.72(b).

40 Claims, 25 Drawing Sheets

U.S. PATENT DOCUMENTS

| | | | |
|---|---|---|---|
| 5,237,193 A | | 8/1993 | Williams et al. |
| 5,258,636 A | | 11/1993 | Rumennik et al. |
| 5,270,264 A | | 12/1993 | Andideh et al. |
| 5,313,082 A | | 5/1994 | Eklund |
| 5,324,683 A | | 6/1994 | Fitch et al. |
| 5,349,225 A | | 9/1994 | Redwine et al. |
| 5,359,221 A | | 10/1994 | Miyamoto et al. |
| 5,386,136 A | | 1/1995 | Williams et al. |
| 5,438,215 A | | 8/1995 | Tihanyi |
| 5,521,105 A | | 5/1996 | Hsu et al. |
| 5,550,405 A | | 8/1996 | Cheung et al. |
| 5,637,898 A | | 6/1997 | Baliga |
| 5,654,206 A | | 8/1997 | Merrill |
| 5,656,543 A | | 8/1997 | Chung |
| 5,659,201 A | | 8/1997 | Wollesen |
| 5,663,599 A | | 9/1997 | Lur |
| 5,670,828 A | | 9/1997 | Cheung et al. |
| 5,679,608 A | | 10/1997 | Cheung et al. |
| 5,716,887 A | | 2/1998 | Kim |
| 5,760,440 A | | 6/1998 | Kitamura et al. |
| 5,821,144 A | | 10/1998 | D'Anna et al. |
| 5,869,875 A | | 2/1999 | Hebert |
| 5,943,595 A | | 8/1999 | Akiyama et al. |
| 5,998,833 A | | 12/1999 | Baliga |
| 6,010,926 A | | 1/2000 | Rho et al. |
| 6,049,108 A | | 4/2000 | Williams et al. |
| 6,184,555 B1 | | 2/2001 | Tihanyi et al. |
| 6,207,994 B1 | | 3/2001 | Rumennik et al. |
| 6,294,818 B1 | | 9/2001 | Fujihira |
| 6,468,847 B1 | * | 10/2002 | Disney ..................... 438/197 |
| 6,489,190 B2 | * | 12/2002 | Disney ..................... 438/188 |
| 6,509,220 B2 | * | 1/2003 | Disney ..................... 438/197 |
| 2002/0175351 A1 | | 11/2002 | Baliga |

FOREIGN PATENT DOCUMENTS

| | | |
|---|---|---|
| JP | 4107877 A | 4/1992 |
| JP | 6-224426 | 8/1994 |
| JP | 06224426 | 12/1994 |
| JP | 2000-349288 | 12/2000 |
| WO | WO 97 35346 | 9/1997 |
| WO | WO 99/34449 | 8/1999 |
| WO | WO 00 33385 | 6/2000 |
| WO | WO 02 41402 | 5/2002 |
| WO | WO 02 099909 | 12/2002 |

OTHER PUBLICATIONS

Appels and Vaes, "High Voltage Thin Layer Devices (RESURF Devices)," IEDM Tech. Digest, pp. 238–241, 1979.

Patent Abstract of Japan, vol. 016, No. 347 (E–1240), Jul. 27, 1992 and JP 107867 (Matsushita Electron Corp.) Apr. 9, 1992.

Air–Gap Formation During IMD Deposition to Lower Interconnect Capacitance, B. Shieh, K.C. Saraswat, IEEE Electron Device Letters, vol. 19, No. 1, Jan. 1998.

Modeling and Optimization of Lateral High Voltage IC Devices to Minimize 3–D Effects, Hamza Yilmaz, R&D Engineering, Semiconductor Business Division, General Electric Company, NC, pp. 290–294.

Theory of Semiconductor Superjunction Devices by Fujihira, T. Matsumoto Factory, Fuji Electric Co., Ltd. Jul. 1997, pp. 31–35.

Yung C. Liang, K.P.Gan and Ganesh S. Sumudra; Oxide-–Bypassed VDMOS (OBVDMOS): An Alternative to Superjunction High Voltage MOS Power Devices; Article dated Aug. 8, 2001, IEEE Electron Devices Letters, vol. 22, No. 8, pp. 407–409.

International Electron Devices Meeting 1979—Washington, D.C. Dec. 3–4–5, Sponsored by Electron Devices Society of IEEE, pp. 238–241.

Japanese Journal of Applied Physics, Part 1, Regular Papers, Short Notes & Review Papers, Oct. 1997; vol. 36, No. 10; pp. 6254–6262.

A New Generation of High Voltage MOSFETs Breaks the Limit Line of Silicon, G. Deboy, M. Marz, J.–P. Stengl, H. Strack, J. Tihanyi and H. Weber, Siemens AG, Semiconductor Division, Munchen, Germany; IEDM 98–683–IEDM 98–685.

IEEE, Jun. 1991; Realization of High Breakdown Voltage (>700V) in Thin SOI Devices by S.Merchant, E. Arnold, H. Baumgart, S. Mukherjee, H. Pein, and R. Pinker, Philips Laboratories, North American Philips Corporation; 1991 IEEE, pp. 31–35.

High Performance 700V Smart Power Technology Based on Thin Layer Silicon–on–Insulator by Letavic et al, pp. 31–35.

High Performance 600V Smart Power Technology Based in Thin Layer Siliconh–on–Insulator; T. Letavic, E.Arnold, M.Simpson, R. Aquino, H. Ghimnathwala, R. Egloff, A.Emmerik, S.Wong, S.Mukherjuee, Philips Research, Philips Electronics North America Corporation, 4 pages.

Comparison of High Voltage Devices for Power Integrated Circuits, R. Jayaraman., V. Rumennik, B. Singer, E.H. Stupp, IEDM 84, pp. 258–261.

"Optimization of the Specific On–Resistance of the COOL-MOS™," Chen, et al., IEEE Transactions on Electron Devices, vol. 48, No. 2, Feb. 2001, pp. 344–348.

"Lateral Unbalanced Super Junction (USJ) / 3D–Resurf for High Breakdown Voltage on SOI," R. Ng, et al., Proceedings of 2001 International Symposium on Power Semiconductor Devices & ICs, Osaka, XP–001026242, Apr. 6, 2001, pp. 395–398.

"Static and Dynamic Electricity," William R. Smythe, McGraw-Hill Book Company, Inc., New York, 1950.

* cited by examiner

HIGH-VOLTAGE TRANSISTOR WITH JFET CONDUCTION CHANNELS

RELATED APPLICATION

This is a continuation-in-part (CIP) application of application Ser. No. 09/723,957, filed Nov. 27, 2000 now U.S. Pat. No. 6,468,847, and entitled, "METHOD OF FABRICATING A HIGH-VOLTAGE TRANSISTOR", which is assigned to the assignee of the present CIP application.

FIELD OF THE INVENTION

The present invention relates to high voltage field-effect transistors. More specifically, the present invention relates to high voltage field-effect transistor structures that include a high-voltage junction field-effect transistor.

BACKGROUND OF THE INVENTION

It is conventional to construct a high-voltage, insulated-gate, field-effect transistor (HVFET) having a high breakdown voltage and a low "on-state" resistance. To accomplish this end, practitioners in the art have used an insulated gate field-effect transistor (IGFET) placed in series with a high-voltage junction field-effect transistor (JFET). Such a transistor is capable of switching at high voltages, has low values of on-state resistance, and has insulated-gate control. Moreover, the HVFET may advantageously be fabricated near low voltage logic transistors on a single integrated circuit chip to form what is commonly referred to as a power integrated circuit (PIC).

Lateral HVFETs with a JFET conduction channel have been used in power conversion applications such as in AC/DC converters for offline power supplies. One goal in such devices is to produce a transistor having a high breakdown voltage ($V_{bd}$) using as small a surface area as possible. In order to achieve high breakdown voltage in these devices is necessary to accurately control the amount of charge in the JFET conduction channel(s) and also in each of the JFET gate layers. For this reason, it is desirable to fabricate such devices using a process that minimizes variance in the charge of each layer.

It is also desirable to fabricate HVFETs that occupy as small a surface area as possible to realize a given on-state resistance. The figure of merit often used is known as specific on-resistance ($R_{sp}$), which is the product of on-state resistance and surface area. A lower $R_{sp}$ allows a smaller area HVFET transistor to be used to meet the on-state resistance requirements of a given application, which reduces the area and, respectively, the cost of the PIC. One way of reducing the on resistance of a HVFET is to incorporate multiple JFET conduction channels into the transistor device.

Another goal in the art is to provide a highly manufacturable HVFET design that consistently delivers the required combination of $V_{bd}$ and $R_{sp}$ over a range of normal process variances. To realize this goal, the manufacturing process should introduce minimal variance in the critical device parameters, and the HVFET should exhibit minimal sensitivity to process variations.

To try to achieve the aforementioned goals, researchers and engineers have experimented with a variety of different structures and processing methods. For example, U.S. Pat. Nos. 5,146,298 and 5,313,082 both describe a method of fabricating an HVFET with multiple JFET conduction channels. The '082 patent teaches a HVFET in which two JFET channels are arranged in parallel to increase charge and reduce $R_{sp}$. A triple diffusion process is disclosed, in which three separate implant and diffusion steps are required to form a HVFET (see FIG. 1 of the '082 patent) that includes N-type top layer 28, P-layer 27, and N-type extended drain region 26. The multiple layers of alternating conductivity types is fabricated by implanting, and then diffusing, dopants into the semiconductor substrate. That is, according to the '082 patent, the N-well region, the P-type buried region, and the N-type extended drain region are all diffused from the surface.

One shortcoming of this prior art approach is that each successive layer is required to have a surface concentration that is higher than the preceding layer, in order to fully compensate and change the conductivity type of the corresponding region. Diffusion of dopants from the surface makes it very difficult to maintain adequate charge balance among the layers. In addition, the heavily doped p-n junction between the buried layer and drain diffusion region degrades the $V_{bd}$ of the device. The concentrations also tend to degrade the mobility of free carriers in each layer, thereby compromising the on-resistance of the HVFET. As a result of these difficulties, this method of manufacture is generally limited to producing HVFET devices having no more than two JFET conduction channels.

Another method of fabricating an HVFET with multiple JFET conduction channels is disclosed in U.S. Pat. No. 4,754,310. The '310 patent teaches a method of construction that consists of epitaxially depositing material of alternating conductivity types and then forming V-shaped grooves to contact the resulting plurality of layers. This method suffers, however, from the high costs associated with multiple epitaxial deposition processing steps and the formation of the grooves. Furthermore, it is difficult to precisely control the charge in each layer formed by epitaxially deposition. As noted previously, proper charge control is crucial to achieving a device that is characterized by a consistently high breakdown voltage.

A similar method of fabricating an HVFET with multiple JFET conduction channels is described in an article by Fujihira entitled, "Theory of Semiconductor Superjunction Devices," Jpn. J. Appl. Phys., Vol. 36, pp. 6254–6262 (October 1997). Fujihira also teaches the technique of epitaxial growth and the formation of grooves to fabricate the HVFET. This method suffers from the same charge control problems and high manufacturing cost discussed above.

Yet another method of fabricating an HVFET with multiple JFET conduction channels is disclosed in U.S. patent application Ser. No. 09/245,029, filed Feb. 5, 1999, of Rumennik, et. al., which application is assigned to the assignee of the present application. Rumennik teaches the use of multiple high-energy implants through the surface of the semiconductor substrate to form a plurality of buried layers. One drawback of this approach, however, is that the number and maximum depth of the buried layers is limited by the available implantation energy. For example, the maximum boron implantation energy available from a typical high-energy implanter is about 7 MeV. Using the techniques disclosed in Rumennik, such an implanter would allow for the formation of four separate buried layers, providing five JFET conduction channels, with a corresponding specific on-resistance of about 6 ohm-mm$^2$.

By way of further background, U.S. Pat. No. 5,386,136 of Williams teaches a lightly doped drain (LDD) lateral MOSFET transistor having reduced peak electric fields at the gate edge. The peak electric field is reduced due to the presence of a P+ buried layer that pushes the electrical equipotential lines beneath the silicon surface laterally further and more evenly in the direction of the drain contact region. Yamanishi, et al. (JP404107877A) teaches construction of a P-buried layer in an extended drift region using processing technique of dopant segregation by thermal heating.

Thus, there still exists a need for a HVFET device structure having multiple JFET conduction channels that overcomes the problems associated with the prior art.

BRIEF DESCRIPTION OF THE DRAWINGS

The present invention is illustrated by way of example, and not limitation, in the figures of the accompanying drawings, wherein.

DETAILED DESCRIPTION

In the following description, numerous specific details are set forth, such as material types, structures, particular processing steps, etc., in order to provide a thorough understanding of the present invention. Practitioners having ordinary skill in the semiconductor arts will understand that the invention may be practiced without many of these details. In other instances, well-known elements, techniques, and processing steps have not been described in detail to avoid obscuring the invention.

The present invention relates to a high-voltage field-effect transistor with one or more JFET conduction channels that provide a low on-state resistance for a given breakdown voltage. While n-channel HVFETs are presented herein for illustrative purposes, p-channel HVFETs can also be fabricated utilizing complementary processing techniques that appropriately reverse the conductivity types associated with the various regions and layers.

Figure 1A:
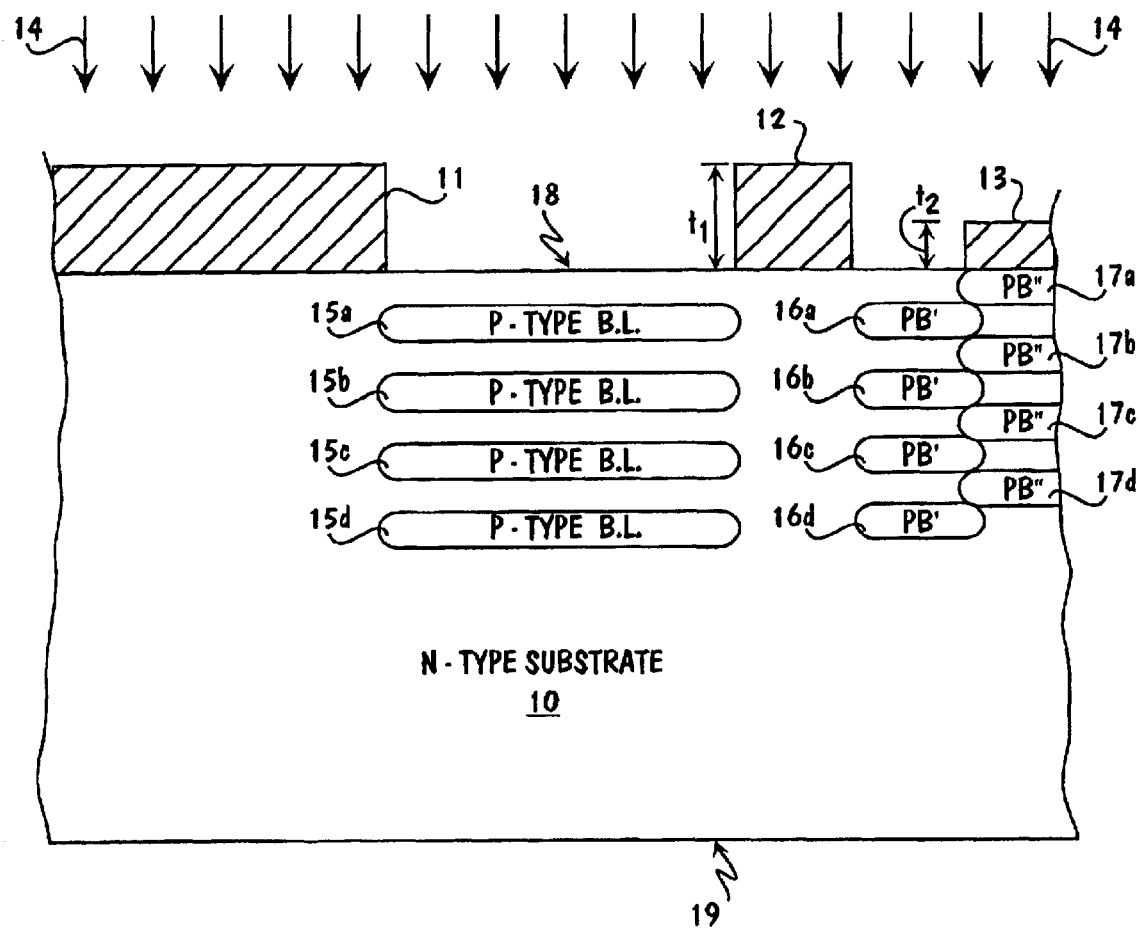
FIGS. 1A–1E are cross-sectional side views illustrating the fabrication of a high-voltage, field-effect transistor (HVFET) device structure in accordance with one embodiment of the present invention.

Referring now to FIG. 1A, a cross-sectional view of an N-type substrate 10 following formation of the buried regions 15–17 is shown. Substrate 10 comprises a top surface 18 and a bottom surface 19. In the described embodiment, substrate 10 is uniformly doped N-type. The doping level is chosen to provide the required amount of charge in each of the JFET conduction channels of the final HVFET device. The JFET conduction channels comprise the N-type regions disposed between the P-type buried layers 15 in FIG. 1A. In accordance with the present invention, buried layers 15 and their associated JFET conduction channels are formed in a laterally extended region of the substrate that eventually will be part of the laterally extended drain of the completed HVFET.

Practitioners in the art will appreciate that the laterally extended region may also comprise the high-voltage portion of another lateral power device. For example, high-power diodes, JFETs, LIGBTs, and so on may also be incorporated in the laterally extended region of the HVFET.

In one embodiment, substrate 10 includes an etch-stop layer and/or cleave plane to facilitate control of the final thickness of this layer (after wafer bonding and etch-back, as will be described shortly below). It is appreciated that substrate 10 may comprise an epitaxial layer. In another embodiment, substrate region 10 may comprise an implanted and diffused N-well region formed in a uniformly doped P-type substrate material.

The buried regions 15–17 of FIG. 1A are formed using conventional photolithography followed by implantation of a P-type dopant such as boron into substrate 10. For example, masking layer members 11, 12, and 13 are formed on top surface 18 and multiple implantation steps have been performed through top surface 18 (represented by arrows 14) to form the multiple P-type buried layers shown. The dose and energy for each of the ion implants is chosen to provide the required amount of charge in each of the buried layers 15, and also in the corresponding JFET conduction channels. The N-type conduction channels around the P-type buried layers 15 provide paths for current to flow in the extended drain region of the HVFET.

For a given implantation energy, the thickness of masking layer members 11–13 affects the penetration of the dopant into substrate 10. As can be seen, both masking members 11 and 12 have a thickness $t_1$ that effectively prevents any dopant ions from penetrating into the substrate material. Conversely, where top surface 18 is exposed, the depth of individual buried layer regions 15 and 16 is determined according to the energy and dose of each implant step.

Note that according to the embodiment shown, corresponding P-type buried layer regions 15 and 16 (labeled PB') are formed simultaneously using the same implantation step. For instance, buried layer regions 15a & 16a are formed at the same depth in substrate 10 utilizing the same implantation step. Similarly, buried layer region pairs 15b & 16b, 15c & 16c, and 15d & 16d are each formed using the identical implant processing step. The difference in vertical depth between the buried layer regions 15a–d and 16a–d relative to the top surface is due to differences in implant energy and dose associated with each of the multiple implantation steps. The exposed portions of surface 18 may also be covered with additional layers of material, such as oxide, to screen or block the implants.

It should be understood that the PB' buried layer regions 16 are optionally included in the process of the present invention. In other words, alternative embodiments may exclude these PB' buried layer regions. In the embodiment represented by FIGS. 1A–1E, buried layer regions 16 are formed an area beneath the substrate surface where the source region of the HVFET will be located.

FIG. 1A also illustrates how a difference in thickness of the surface masking layer may be utilized to achieve buried layer regions 17 disposed at different depths within substrate 10 relative to corresponding regions 15 and 16. In this case, masking layer member 13 is purposefully formed to have a thickness $t_2$ that is less than thickness $t_1$. Thickness $t_2$ is chosen to cause buried layer regions 17a–17d (labeled PB") to be formed at a slightly shallower, offset depth as compared to corresponding buried layer regions 16a–16d. Masking layer members 11–13 may comprise oxide, nitride, photoresist, or any other suitable material.

By appropriate selection of the thickness $t_2$ of masking member 13 and implant energy, the adjacently formed PB' and PB" buried layer regions will form a continuous region of P-type doping extending below surface 18 of substrate 10. This continuous P-type region may be used to isolate the HVFET from other circuitry fabricated in the same substrate. This aspect of the invention will be discussed in more detail below.

It should be understood that for this embodiment the PB" buried layer regions 17a–17d may be formed using the same implantation steps used to form the corresponding PB' buried layer regions 16a–16d (and also P-type buried layer regions 15a–15d).

Figure 1B:
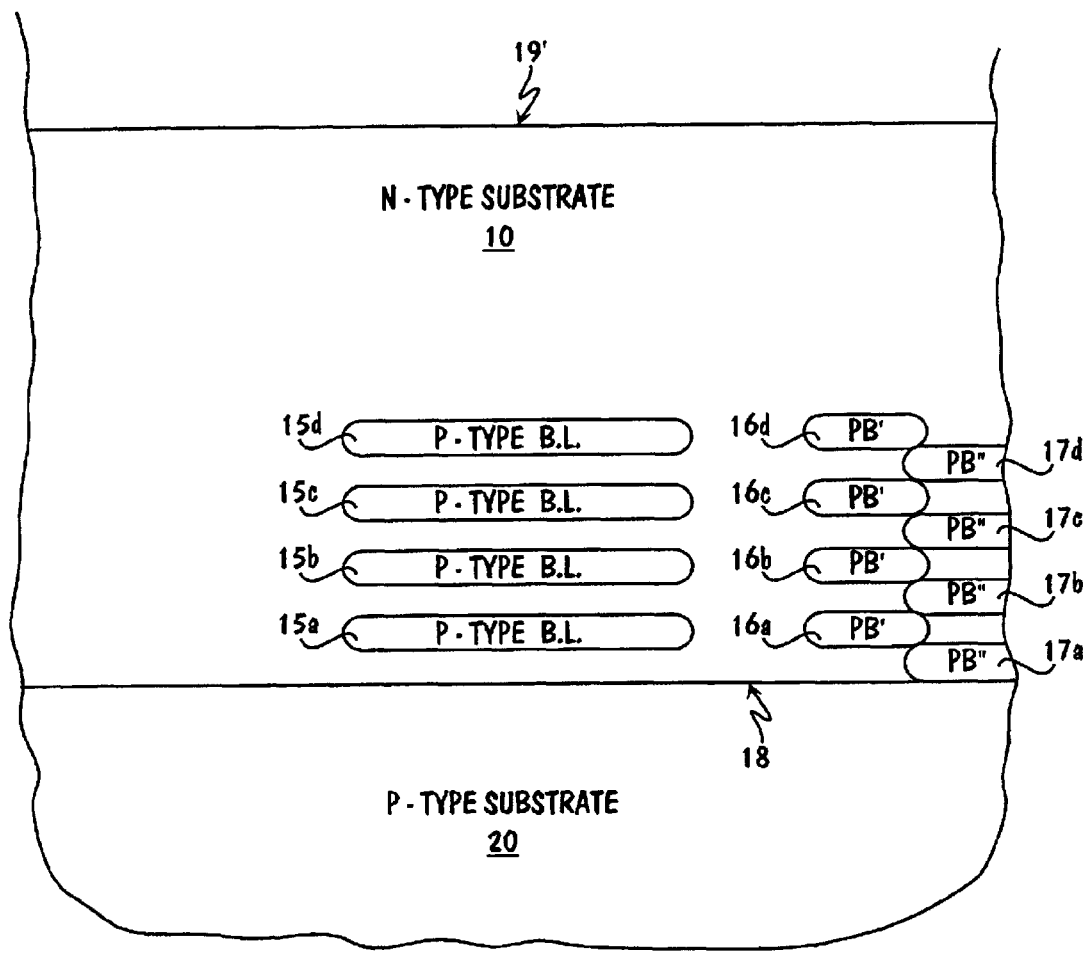

FIG. 1B is a cross-sectional view of substrate 10 after it has been flipped over and bonded to P-type substrate 20. The bonding of top surface 18 to substrate 20 may be achieved by conventional wafer bonding techniques. During the wafer bonding process, a relatively low temperature is preferably maintained to avoid out-diffusion of the P-type buried layers 15–17. Since the bonded interface between substrate 10 and substrate 20 will lie within the depletion region of the HVFET under reverse bias, the interface should ideally be free of traps, voids, and contamination.

FIG. 1B also shows the device at a stage in the fabrication process after thinning of substrate 10. According to the embodiment of FIG. 1B, thinning occurs from the top down, i.e., from surface 19 down toward surface 18. After thinning, the new top surface of the device substrate is denoted by numeral 19' in FIG. 1B. Thinning may be performed using any one of a variety of techniques, including conventional chemical etching, mechanical, or chemo-mechanical methods.

In one embodiment, an etch stop layer or cleave plane is embedded within substrate 10 where surface 19' is to be located, so as to provide good control over the final thickness of substrate 10. As will be seen shortly, the final thickness of substrate 10 is important in establishing the spacing between buried layer region 15d and buried layer region 15e, as formed in subsequent processing steps.

Figure 1C:
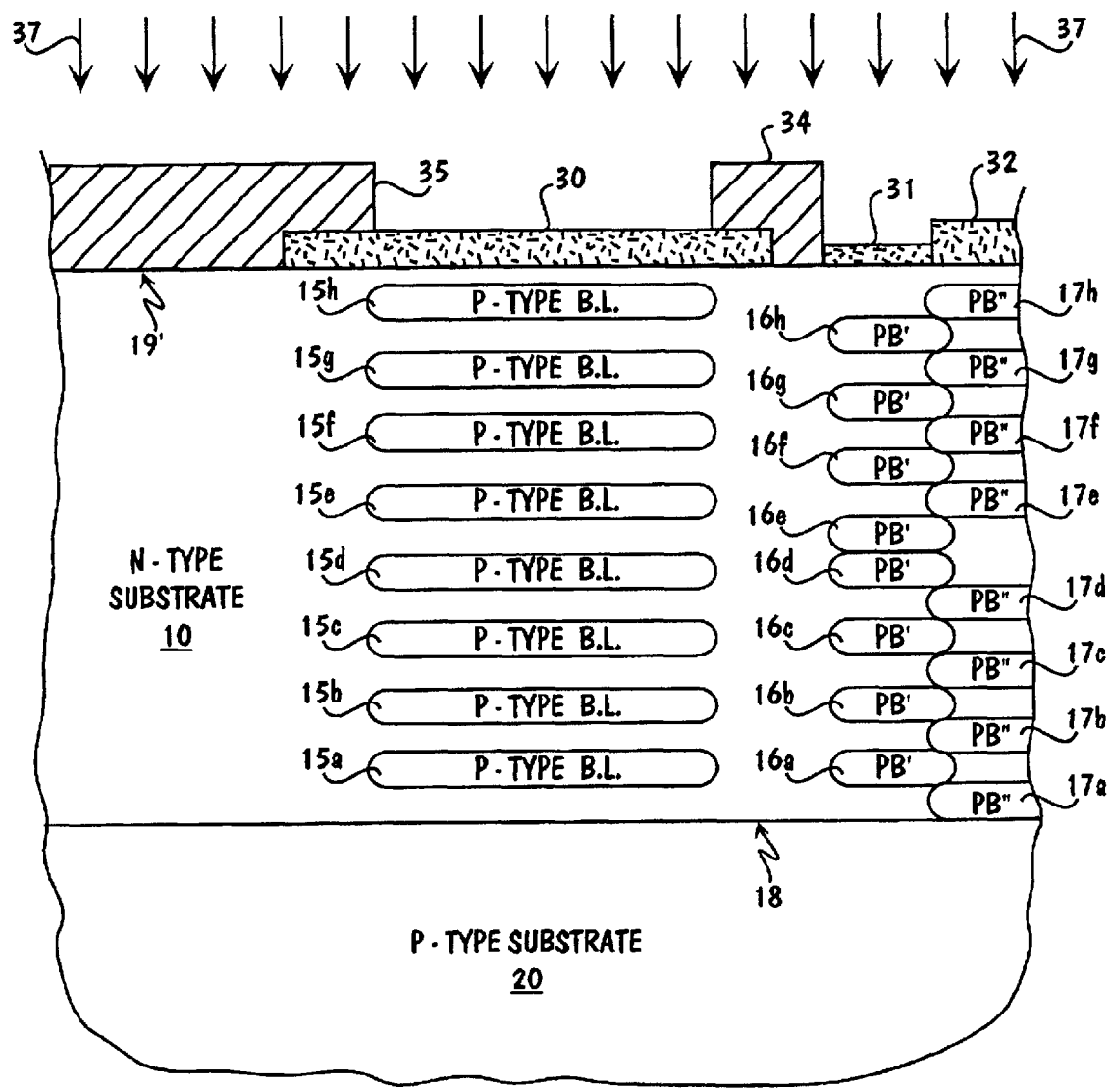

FIG. 1C is a cross-sectional view of the device of FIG. 1B following formation of uppermost buried layer regions 15e–15h, 16e–16h, and 17e–17h. (Once again, it should be understood that buried layers 16 and 17 are optionally included in the embodiment shown.) Uppermost buried regions 15e–15h, 16e–16h, and 17e–17h may be formed utilizing similar photolithography and ion implantation steps used to form the underlying buried layer regions 15a–15d, 16a–16d, and 17a–17d. In this example, an optional oxide layer 30 is first grown or deposited on surface 19' of substrate 10. Oxide layer 30 may become the field oxide of the final HVFET. Ideally, optional oxide layer 30 is produced using low temperature processing techniques to minimize out-diffusion of the previously formed buried layers. Another layer 32 may also be provided with the same thickness as layer 30.

Masking layer members 31, 34 and 35 are formed over surface 19' and multiple implantation steps are performed (represented by arrows 37) to form the multiple, uppermost P-type buried layers and corresponding JFET conduction channels shown. The dose and energy of each implant is chosen to provide the required amount of charge in each of the uppermost P-type buried layers and also in the corresponding JFET conduction channels. The thickness of members 34 and 35 is chosen to completely block the implant.

The thickness of layer 30 allows implant ions to penetrate to a certain depth in the substrate. Because buried layer regions 15e–15h and 16d–16h are each formed using the same implantations, the relatively thinner masking layer 31 produces a set of buried layer regions 16d–16h that are disposed more deeply within substrate 10, as compared with the corresponding buried layer regions 15d–15h, respectively. As shown, the relatively thinner masking layer 31 produces a buried layer region 16e that is merged with underlying buried layer region 16d. In this embodiment, merging of regions 16d and 16e is important to establish a continuous P-type isolation region that extends from the source region down to substrate 20 in the completed device structure. This continuous P-type isolation region may be used to isolate the HVFET from other circuitry.

The cross-sectional side view of FIG. 1C also shows the optional inclusion of P-type buried layer regions 17e–17h (labeled PB") formed adjacent, and connected to, corresponding PB' buried layer regions 16e–16h. These PB" buried layer regions are formed by the same implantation steps used to form the PB' buried layer regions. In the example shown, a masking layer 32 having a thickness greater than that of layer 31 is formed on surface 19' prior to the implantation steps. The greater thickness of masking layer 32 relative to layer 31 causes the respective buried layer regions 17e–17h to be formed at relatively shallower depths as compared to their counterpart buried layer regions 16e–16h. Here again, appropriate selection of mask layer thickness' and implantation energies causes the PB' and PB" buried layer regions to merge, thereby forming a continuous region of P-type doping that extends from just beneath surface 19' down to substrate 20.

Once the extended drain region or drift region of the HVFET has been formed according to the preceding steps, the following fabrication steps may be utilized to complete the device.

Figure 1D:
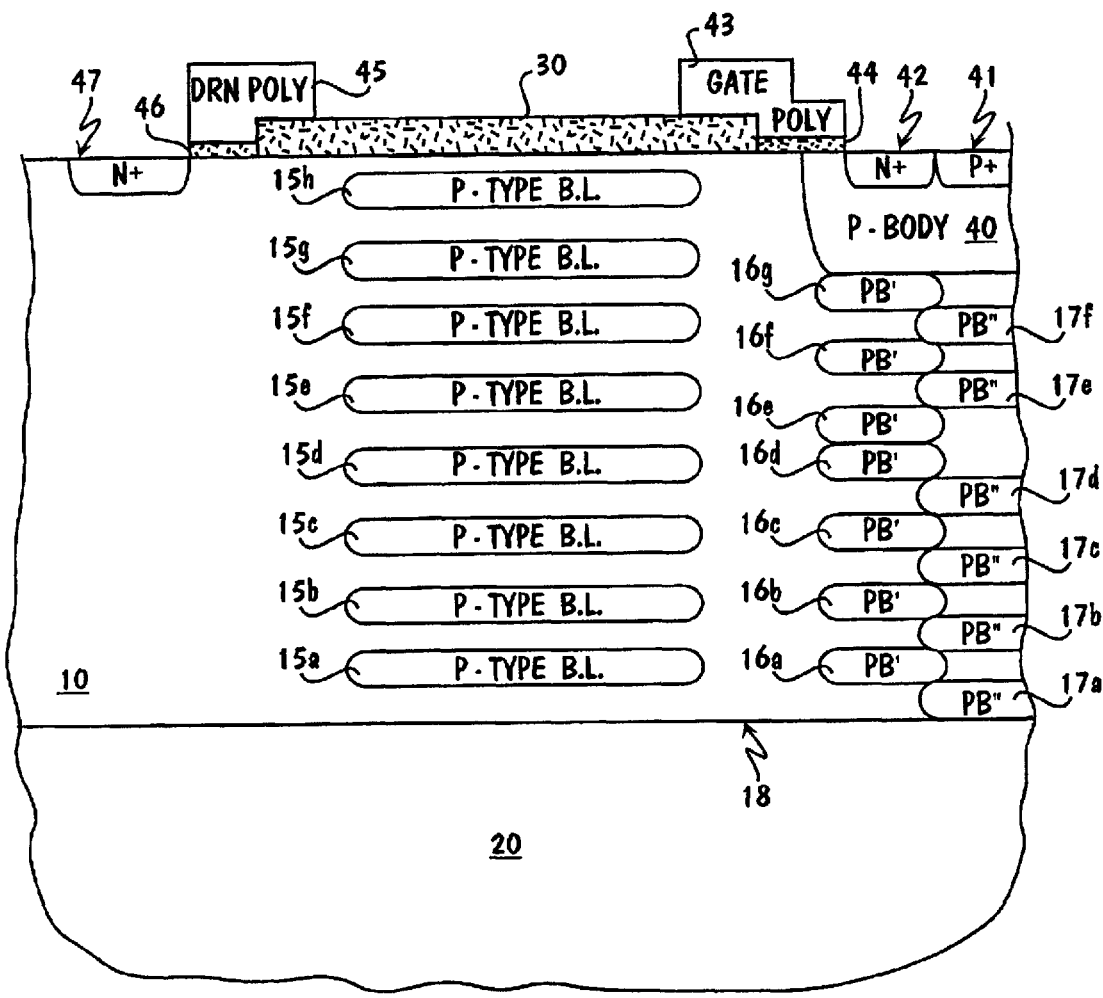

FIG. 1D illustrates a cross-sectional view of an insulated-gate HVFET after the formation of source region 42, drain region 47, and polysilicon gate 43, which is insulated from substrate 10 by a thin gate oxide layer 44. These structural features may be formed by conventional processing techniques.

In the method of manufacturing a high-voltage IGFET, the growth or deposition of gate oxide layer 44 follows the high-energy implantation steps that form the buried layers. After formation of gate oxide layer 44, polysilicon gate 43 may be deposited and patterned. In the particular embodiment shown, a P-type body region 40 is formed prior to the N-type implantation used to simultaneously form source and drain regions 42 and 47, respectively. For clarity purposes, body region 40 is shown merged with P-type buried layer regions 17g, 16h, and 17h. Region 40 may be formed using conventional angled implantation techniques.

The embodiment of FIG. 1D also shows the optional formation of P-type region 41 to increase the integrity of the source-to-substrate connection and reduce susceptibility of the device to parasitic bipolar effects.

Another optional processing step shown in FIG. 1D is the formation of a drain polysilicon member 45. Drain polysilicon member 45 is shown insulated from substrate 10 by oxide layer 46 and extending over a portion of field oxide 30. Similarly, a portion of polysilicon gate 43 is made to extend over part of field oxide 30. These polysilicon extensions are useful for field-plating purposes. Oxide layers 44 and 46 may be formed simultaneously by the same process steps, as may polysilicon layers 43 and 45.

Figure 1E:
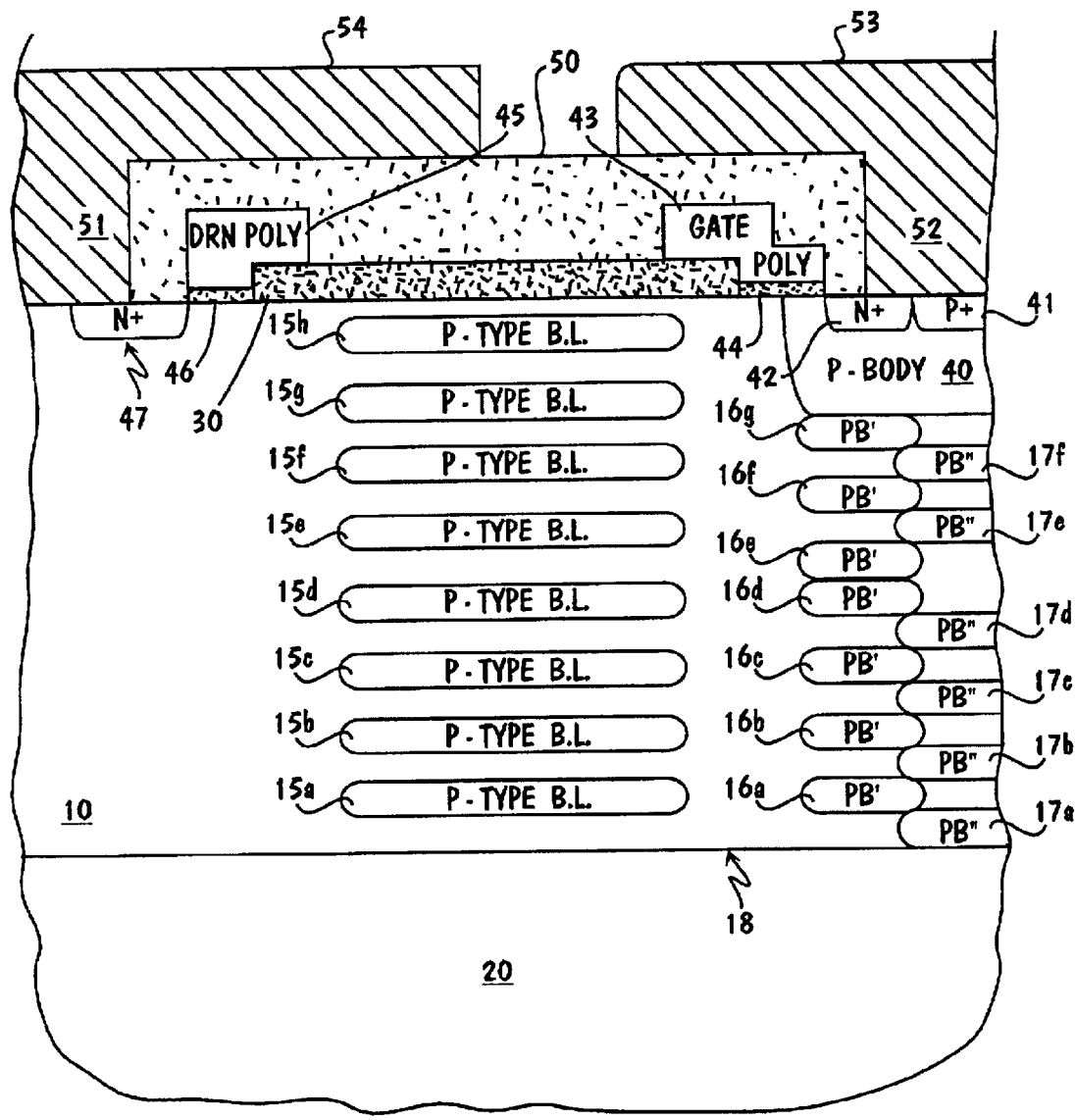

FIG. 1E is a cross-sectional side view of the embodiment of FIG. 1D following the formation of an inter-level dielectric layer 50, etching of contact openings, and deposition and patterning of a conductive layer. The inter-level dielectric layer 50 may be deposited (and then densified or reflowed, if necessary). By way of example, dielectric layer 50 may comprise a low-temperature oxide (LTO).

Conventional photolithography and etching steps are employed to form contacts to the source and drain regions. A suitable conductive material such as aluminum, titanium alloy, or copper is commonly deposited, patterned, and etched to form respective source and drain electrodes 52 and 51, which provide electrical contact to source and drain regions 42 and 47, respectively. Note that electrode 52 also contacts region 41 to provide electrical connection to region 40 and substrate 20 (via layers 16 and 17) in the embodiment shown. Practitioners in the art will appreciate that the HVFET of the illustrated embodiment is typically operated with the source and substrate connected to ground, which provides the double-sided JFET with enhanced switching characteristics.

Furthermore, each of electrodes 51 and 52 may include a portion that extends over dielectric layer 50 to act as a field plate member. These field plate members reduce peaks in the localized electric field, thereby increasing the breakdown voltage of the transistor.

In the completely fabricated device, the IGFET channel region comprises the area of body region 40 directly under gate 43 between N+ source region 42 and the extended drain region, which begins at the lateral boundary of body region 40 and substrate 10. Also note that the embodiment of FIG. 1E shows each of the P-type buried layer regions 15a–15h is surrounded above, below and laterally by N-type material of substrate 10; the JFET conduction channels being formed in a parallel manner between the corresponding buried layer regions. It is appreciated that the separation of buried layer regions 15 from N+ drain region 47 by a portion of the N-type substrate 10 improves the breakdown voltage of the transistor.

When the HVFET is in the on-state, electron current flows from the source diffusion region 42 through the IGFET channel region beneath gate 43, then through the parallel JFET channels formed between buried layer regions 15a–15h, and finally to drain diffusion region 47. The formation of a large number of parallel-configured P-type buried layers (e.g., 8 in this example) and their corresponding JFET conduction channels (e.g., 9 in this example) greatly reduces the resistance of the extended drain region as compared to a conventional device.

In one particular implementation of the HVFET process, each of the buried layer regions 15 includes a connection to substrate 20 (not shown in the cross-sectional views 1A–1E) or another region having substantially the same potential. This insures that buried layer regions 15 are not left floating (electrically).

Figure 2:
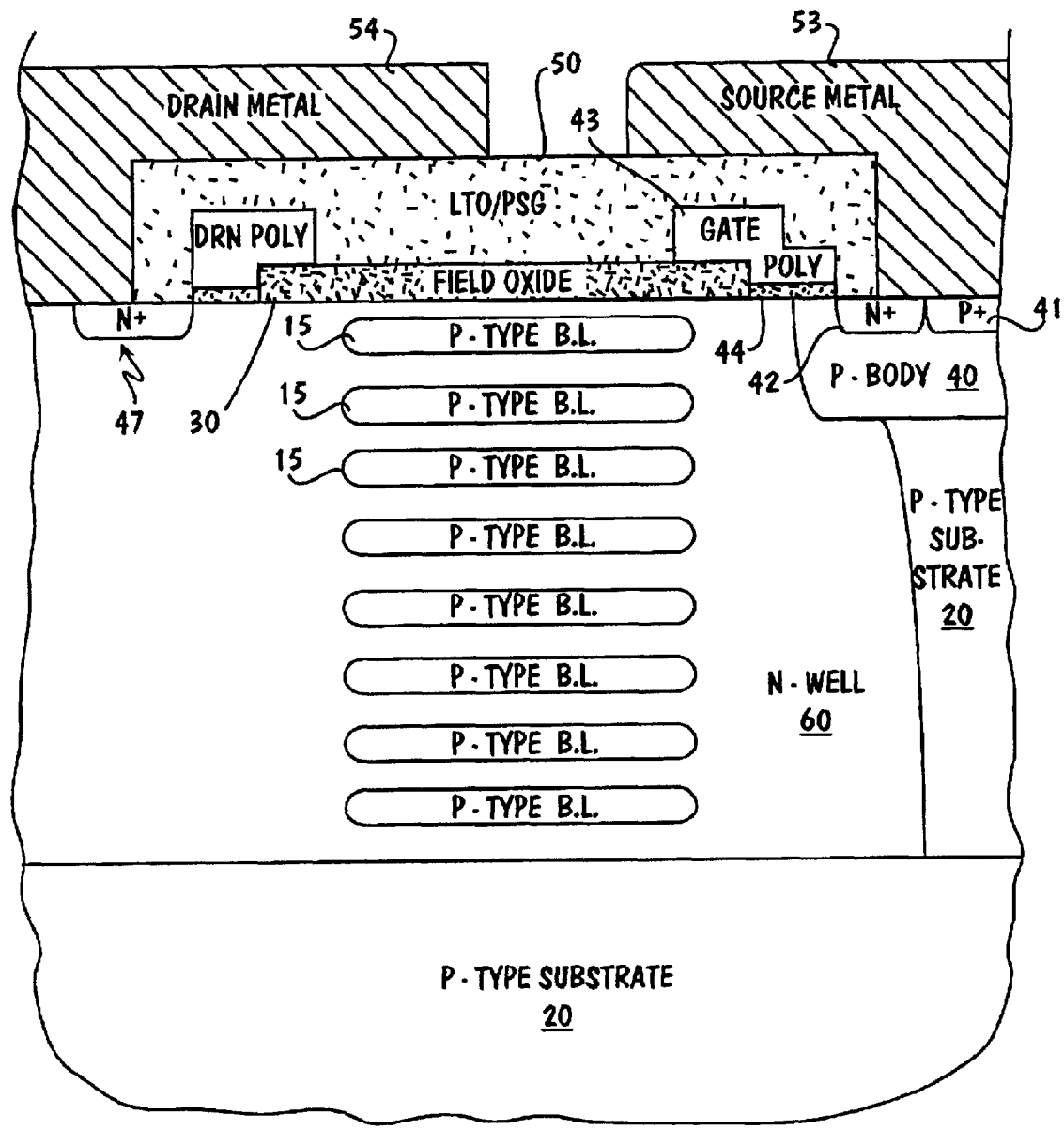
FIG. 2 is a cross-sectional side view of a HVFET according to an alternative embodiment of the present invention.

Another embodiment of the invention is shown in FIG. 2. This embodiment obviates the need for a uniformly doped N-type starting substrate material. Instead, a diffused N-well region 60 is initially formed in a P-type substrate 68 using ordinary processing techniques. N-well region 60 is fabricated prior to introduction of the buried layers 15. In this embodiment, the HVFET can be effectively isolated from other circuitry by the lateral junction of N-well 60 and P-type substrates 20 and 68. Thus, the approach of FIG. 2 obviates the need for the aforementioned steps associated with the formation and merging of the PB' and PB" layers.

Figure 3:
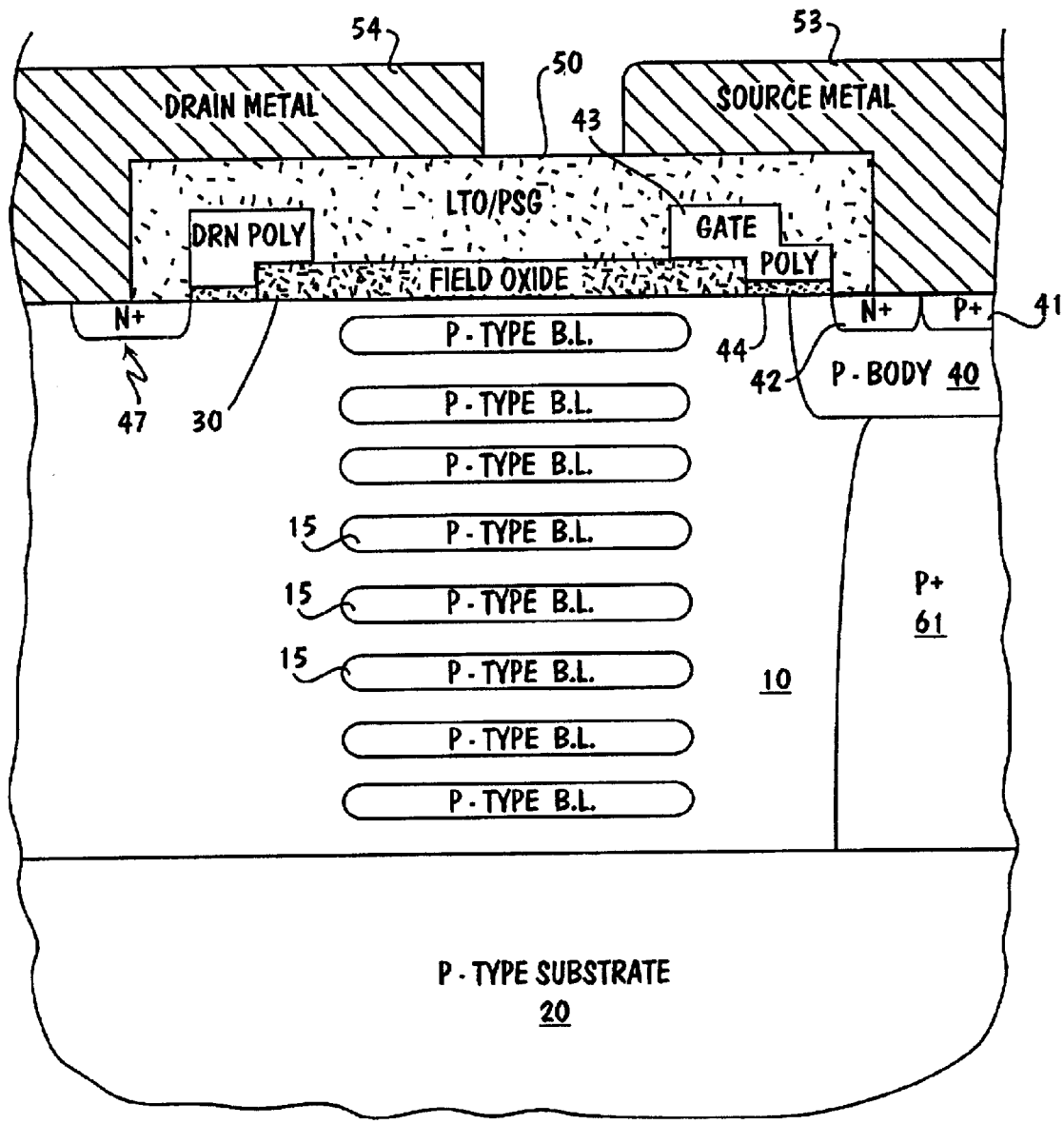
FIG. 3 is a cross-sectional side view of a HVFET according to another alternative embodiment of the present invention.

Yet another alternative embodiment is shown in the cross-sectional side view of FIG. 3. Rather than forming a continuous P-type region by merging PB' and PB" layers 16 and 17, a deep P-type diffusion into the N-type substrate 10 is performed prior to formation of the first plurality of buried layers (e.g., regions 15a–15d). During the subsequent formation of P-type body region 40, deep P+ diffusion region 61 merges with region 40 to provide isolation of the HVFET from other circuitry fabricated on the same substrate.

Figure 4:
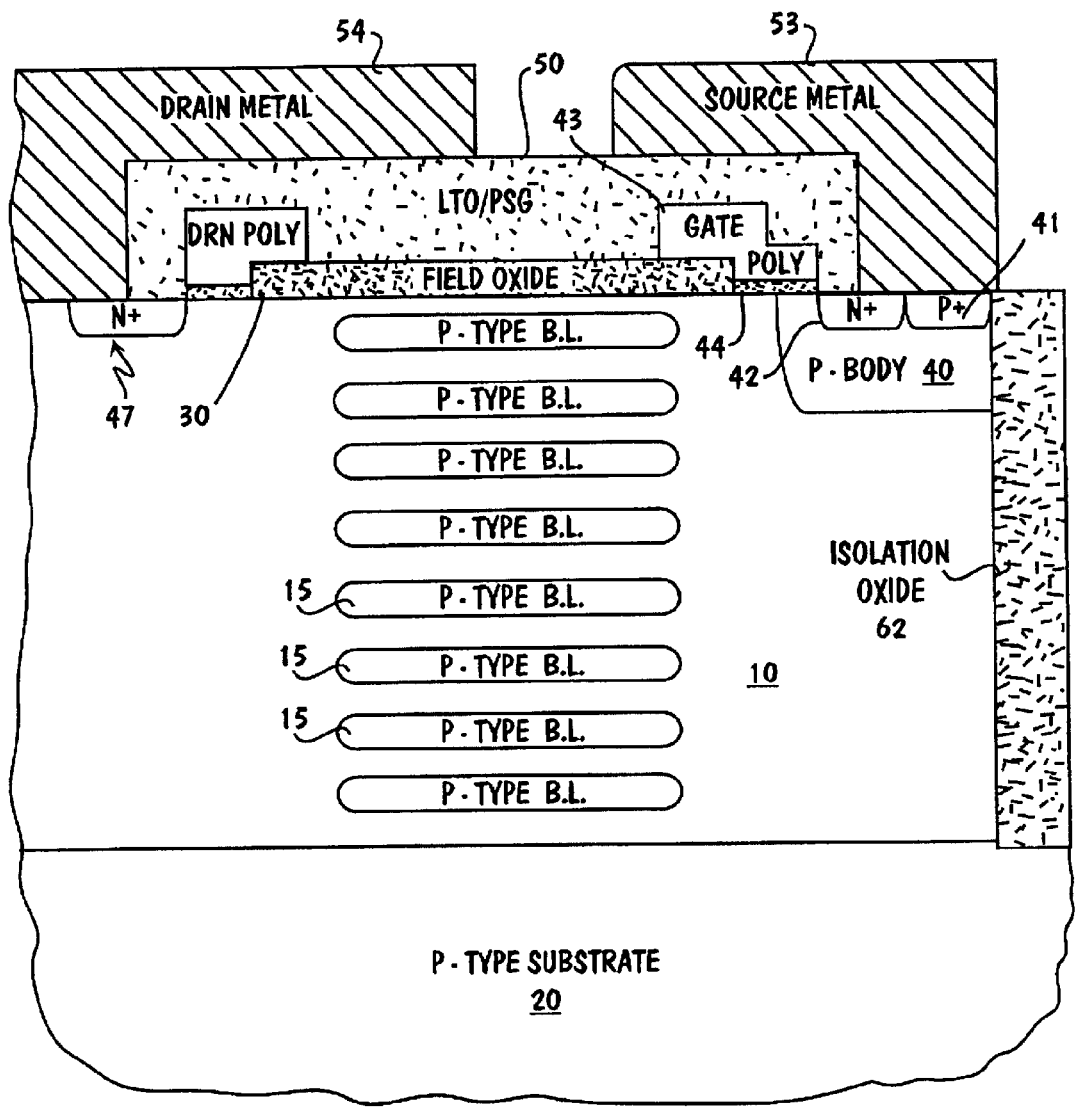
FIG. 4 is a cross-sectional side view of a HVFET according to yet another alternative embodiment of the present invention.

FIG. 4 shows still another embodiment of the invention in which a trench isolation oxide region 62 is formed in substrate 10 to electrically isolate the HVFET. By way of example, the trench may be formed by conventional etching methods after substrate 10 has been bonded to substrate 20 and thinned, as described previously. A low-temperature oxide may be used to fill the isolation trench region.

Figure 5:
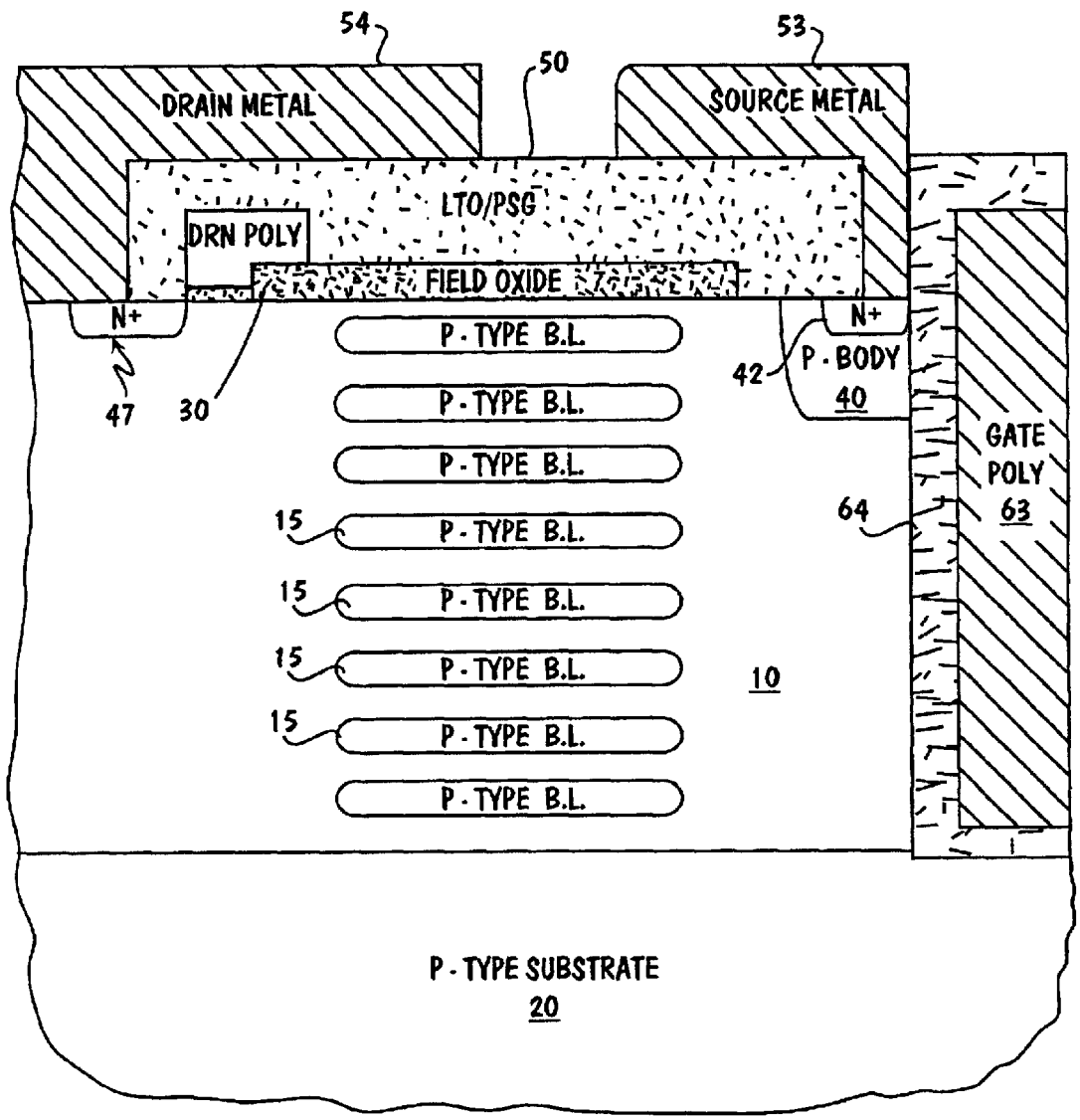
FIG. 5 is a cross-sectional side view of a HVFET according to still another alternative embodiment of the present invention.
Figure 6:
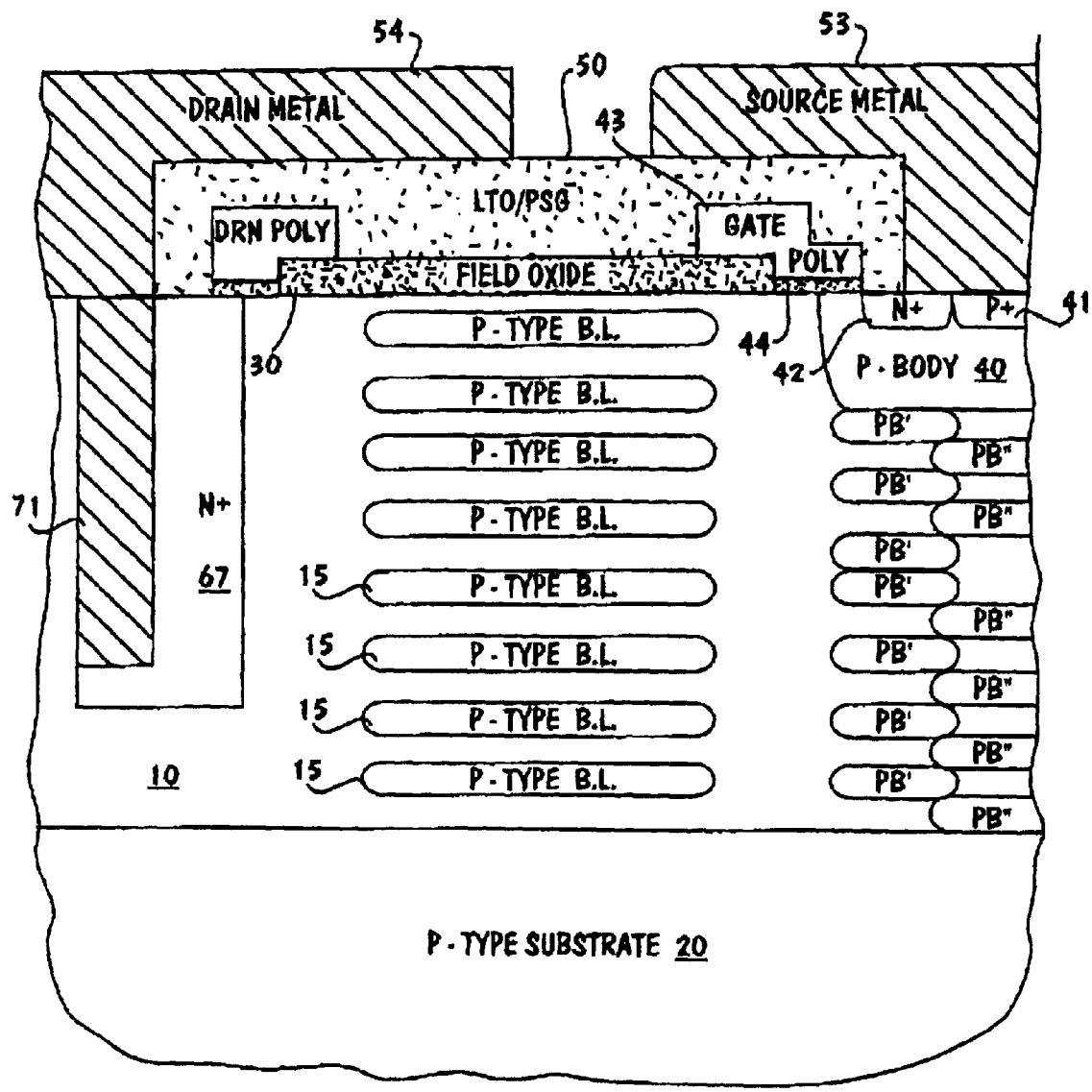
FIG. 6 is a cross-sectional side view of a HVFET according to a further alternative embodiment of the present invention.

The alternative embodiments shown in FIGS. 5 & 6 involve replacing the gate and/or drain regions of the device with trench structures to provide more uniform current flow through the parallel-configured JFET conduction channels.

For example, the device structure shown in the cross-section of FIG. 5 may be produced by replacing the formation of gate 43 (see FIG. 1E) with the following processing steps. First, a deep trench region is etched down to substrate 20 in substrate 10 adjacent to the source region of the device. Next, gate oxide layer 64 is formed followed by formation of a vertical polysilicon gate 63. The remainder of the HVFET may be completed in accordance with the teachings associated with FIGS. 1D & 1E.

The device structure shown in the cross-section of FIG. 6 may be produced by replacing the formation of N+ drain diffusion region 47 with etching and diffusion steps that form a N+ drain trench region 67 extending deeply into substrate 10. In this particular embodiment, the drain electrode includes a segment 71 that extends into the trench to contact drain trench region 67.

Although the processing steps in the foregoing description are for fabrication of an n-channel HVFET, it is appreciated that a p-channel HVFET can be realized by simple reversal of the conductivity types employed to form the various regions/layers.

Figure 7A:
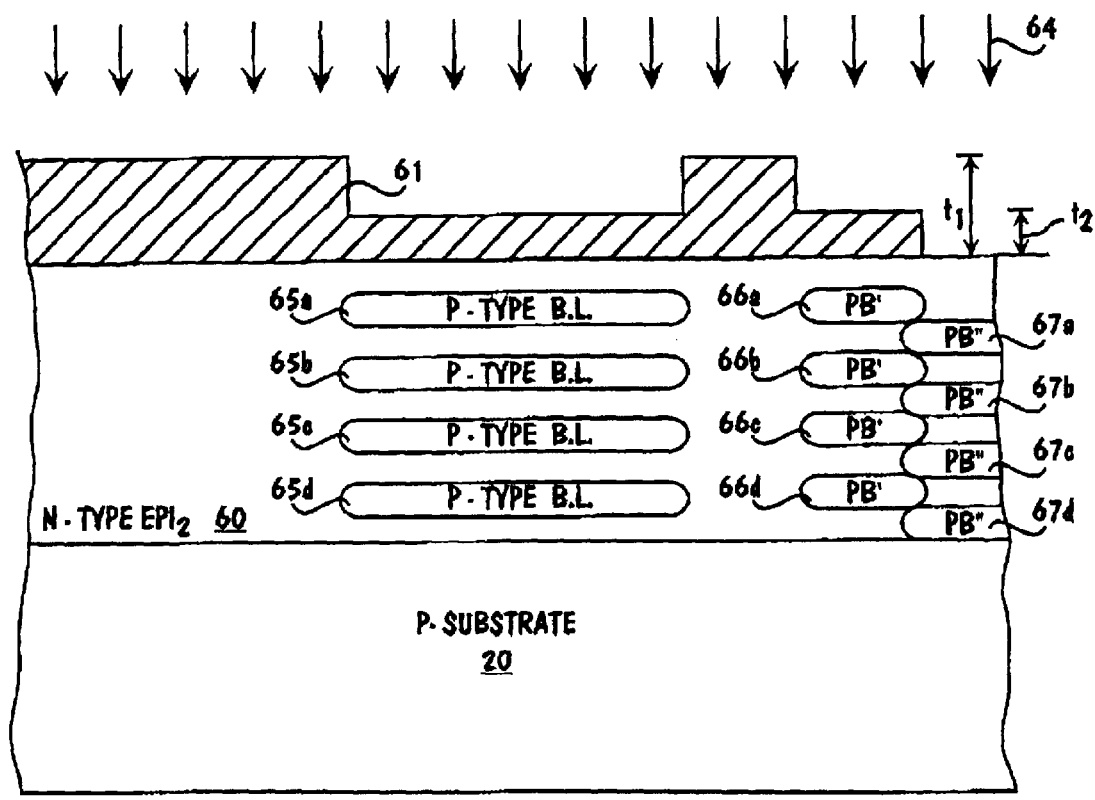
FIGS. 7A–7E are cross-sectional side views illustrating the fabrication of a high-voltage, field-effect transistor (HVFET) device structure in accordance with still another alternative embodiment of the present invention.

Referring now to FIG. 7A, there is shown a cross-sectional view of a first N-type epitaxial layer (Epi$_1$) 60 deposited on a P-type substrate 20 in accordance with another embodiment of the present invention. To fabricate a device with a breakdown voltage of 700V or more the substrate is doped to a resistivity of about 100–150 ohm/cm. The N-type epitaxial layer thickness and doping level are chosen to provide the proper charge balance among the alternating P-type and N-type layers that are formed in the device. A multi-level masking layer 61 is formed on top of epitaxial layer 60 followed by multiple ion implantations (shown by arrows 64) to form multiple P-type buried layers 65. For example, a thickness $t_1$ is formed to prevent dopants from being implanted in selected regions of epitaxial layer 60. A thickness $t_2$ permits the formation of a first set of buried layers 65 (and optional layers 66) whereas the absence of masking layer 61 results in the optional formation of buried layers 67.

The dose and energy of each implant is chosen to provide the required amount of charge in each of the P-type buried layers, as well as in the corresponding JFET conduction channels that are formed in the N-type material above and below each of buried layers 65a–65d. By way of example, the charge in each of the conduction channels and in each of the buried layers may be in the range of $1.5-2.5 \times 10^{12}$ cm$^{-2}$. Although four P-type buried layers 65a–65d are shown in FIG. 7A, more or fewer layers may be formed by implantation depending on the maximum available ion implantation energy.

The cross-section of FIG. 7A also shows the optional inclusion of P-type buried layers 66 (PB') and 67 (PB") in the area where the source region of the transistor is formed by subsequent processing steps. The PB' layers 66 and PB" layers 67 are formed by the same implantation steps used to form buried layers 65. As can be seen, appropriate selection of the thickness $t_2$ of masking layer 61 and the energy of implantation 64 allows for the merging of layers 66a–66d and 67a–67d to form a continuous region of P-type doping. This continuous P-type region may be used to isolate the HVFET from other circuitry fabricated in the same epitaxial layer.

It should be understood that the inclusion of layers 67 is a separate option to the inclusion of layers 66, which are also an option to the embodiment of FIGS. 7A–7E. In other words, certain implementations may include PB' layers 66 without PB" layers 67.

Figure 7B:
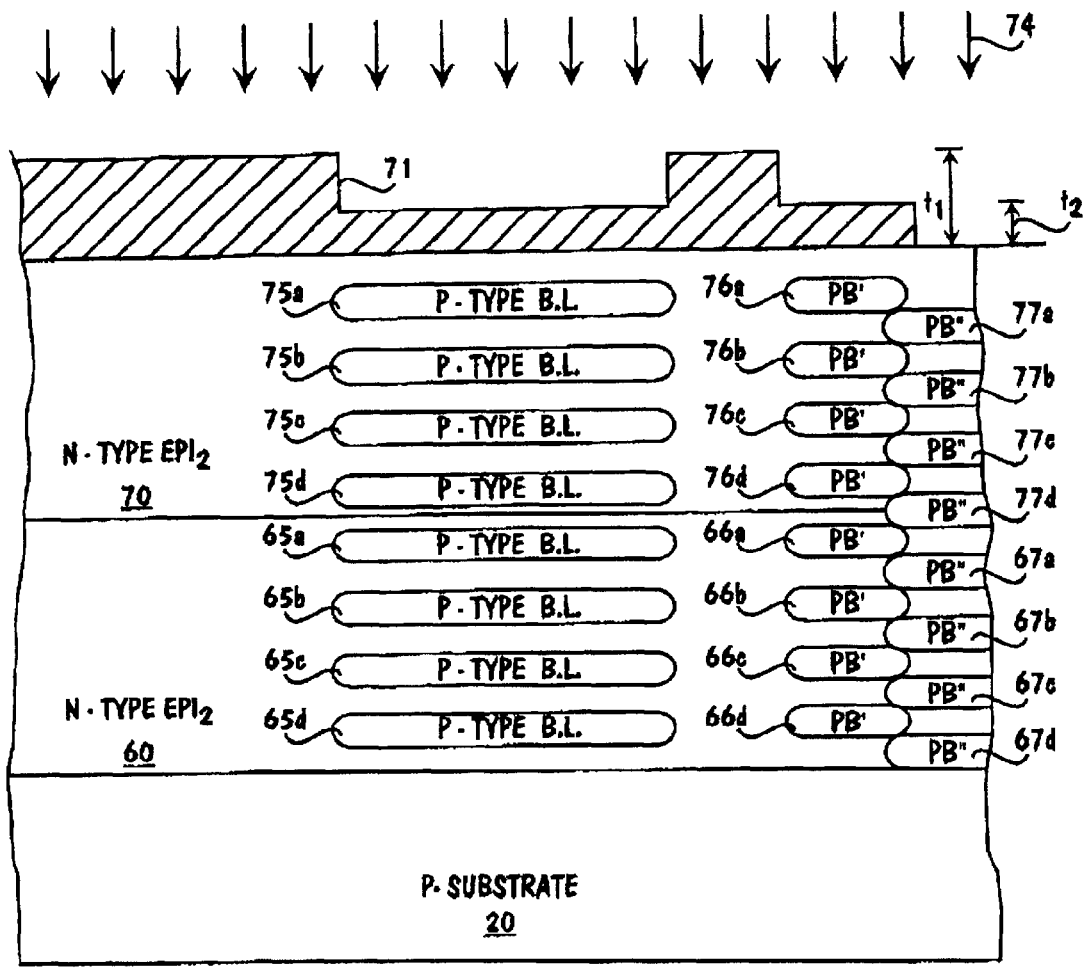

FIG. 7B shows the embodiment of FIG. 7A after a second N-type epitaxial layer 70 has been formed on the upper surface of epitaxial layer 60. Again, the thickness and doping level of N-type epitaxial layer 70 are chosen to provide charge balance among the second set of alternating P-type buried layers 75a–75d and N-type conduction channels formed in the device by multiple ion implantations 74 through multi-level masking layer 71. In one implementation the charge in each of the conduction channels and each of the buried layers may be in the range of $1.5-2.5 \times 10^{12}$ cm$^{-2}$. Because the uppermost N-type conduction channel at the surface of epitaxial layer 70 is not sandwiched between two P-type buried layers, there may be less charge (e.g., half) in the uppermost layer as compared to the other conduction channels.

Optional PB' layers 76 and PB" layers 77 may be formed in epitaxial layer 70 in the same manner described above for layer 60. Note that PB" layer 77d is formed to merge with PB' layers 76d and 66a, so that a continuous P-type doping region is formed from the top of layer PB' 76a down to P-substrate 20. Following the formation of P-type buried layers 75 in epitaxial layer 70 (along with PB' and PB" layers 76 & 77, if optionally included) the extended drain region of the HVFET is essentially complete.

Practitioners in the art will appreciate that the foregoing processing sequence of epitaxial deposition followed by formation of multiple P-type buried layers may be repeated to produce a device with even more JFET conduction channels in the extended drain region of the HVFET.

Figure 7C:
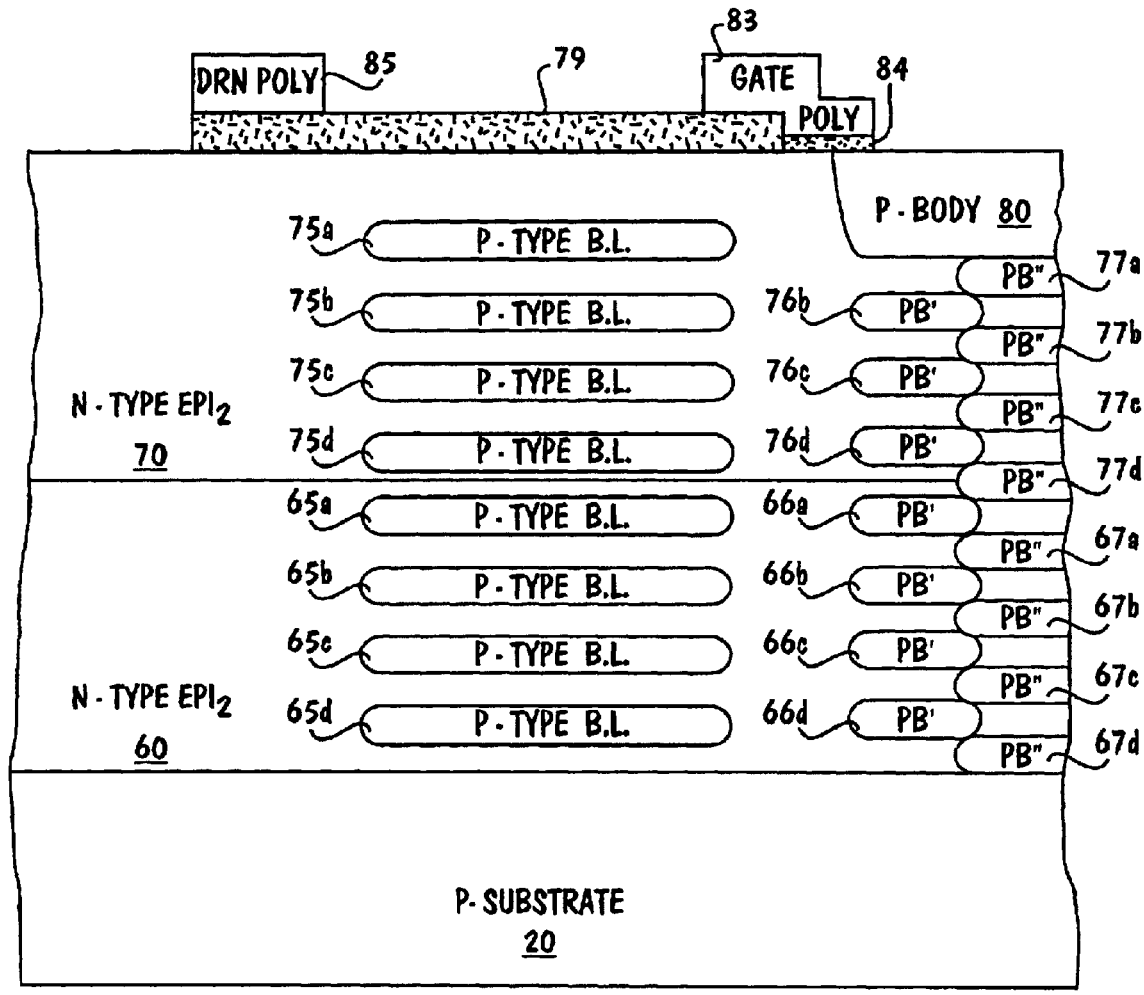
Figure 7D:
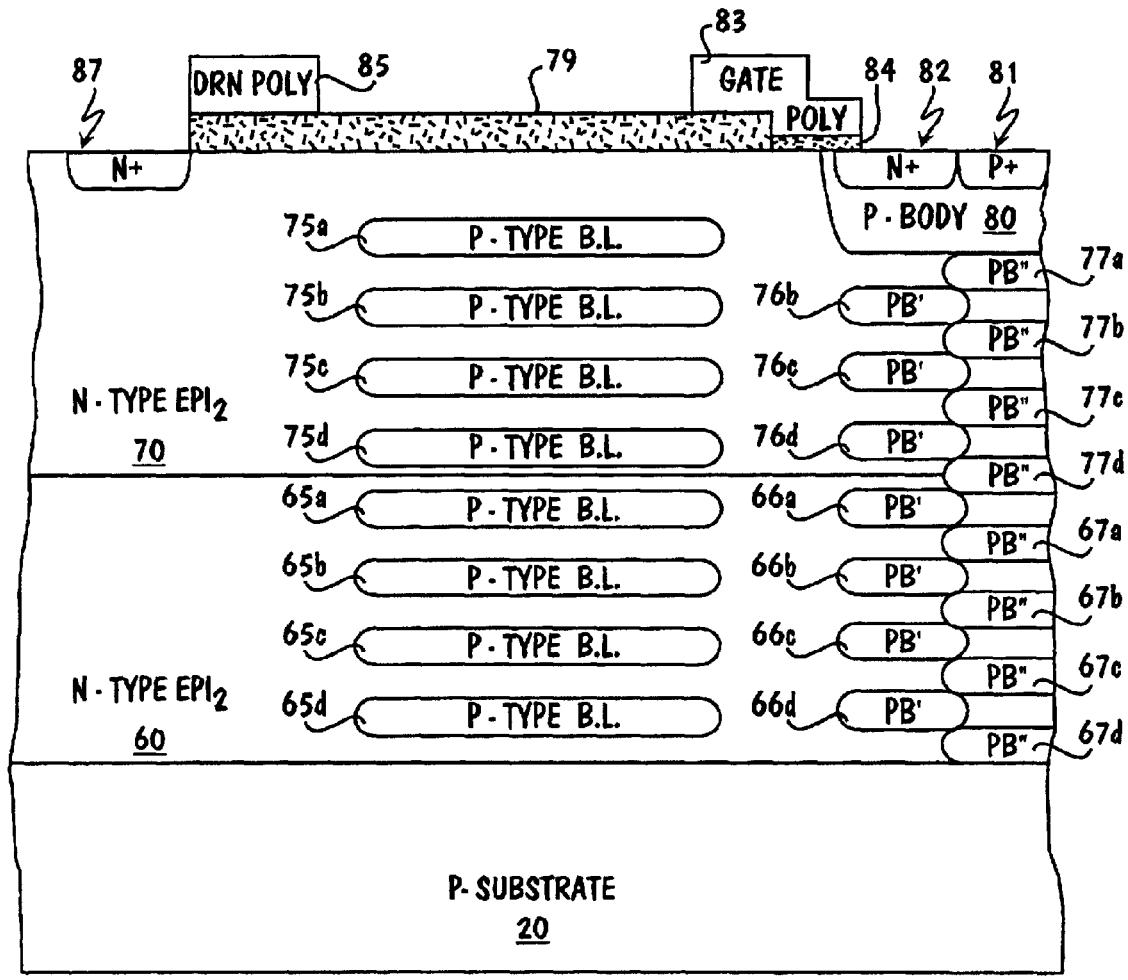
Figure 7E:
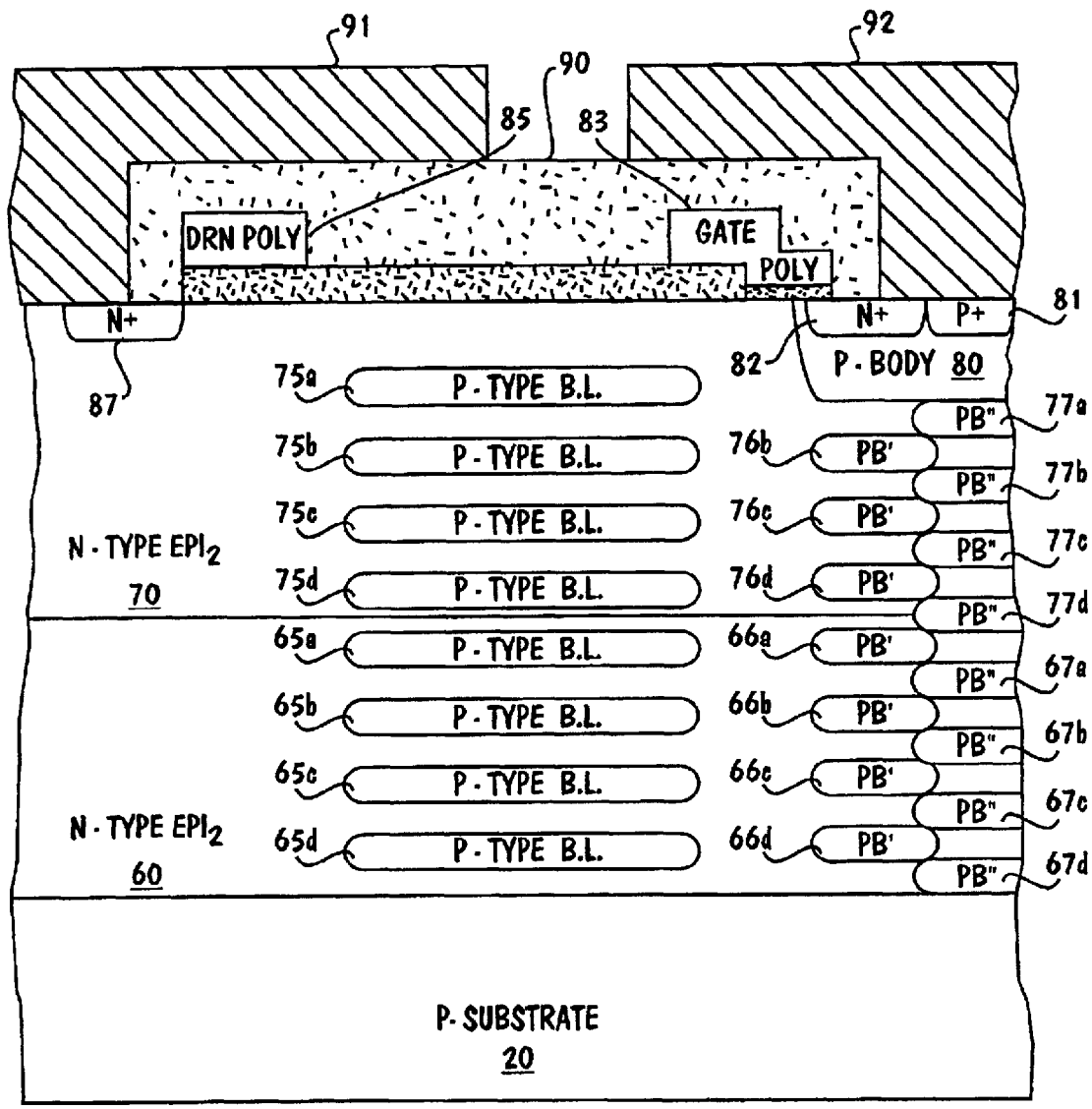

FIGS. 7C–7E illustrate the processing steps employed to form an insulated gate HVFET having an extended drain region fabricated according to the method described above for FIGS. 7A–7B. By way of example, FIG. 7C shows the device after formation of a field oxide layer 79 and gate oxide layer 84 over the upper surface of epitaxial layer 70. Gate oxide layer 84 is formed above the MOS channel region of the device. Field oxide layer 79 is disposed above the drift region of the device and may be formed utilizing low temperature processing techniques that minimize diffusion of the underlying P-type buried layers. Although field oxide layer 79 provides flexibility in the formation of field plate members at the source and drain ends of the device, it should be understood that certain alternative embodiments may constructed without field oxide layer 79.

The example of FIG. 7C also shows the formation of a polysilicon gate member 83. Gate member 83 includes a field plate that extends over a portion of field oxide 79. A polysilicon drain field plate member 85 is also shown formed over a portion of field oxide 79 near where the drain region of the device will be located. FIG. 7C further illustrates the formation of a P-type body region 80 in epitaxial layer 70. Note that in the example of FIG. 7C, body region 80 extends down to the depth of optional PB" layer 77a. Body region 80 may be formed by conventional implantation techniques either before or after the formation of the oxide layers 79 & 84 and polysilicon layers 83 & 85. To minimize diffusion of the P-type buried layers 75 & 65, body region 80 should be formed using low temperature processing steps.

FIG. 7D shows the device of FIG. 7C after formation of N+ source and drain regions 82 and 87, respectively. Also included is an optional P+ region 81 located adjacent to N+ source region 82 to provide contact to body region 80 of the MOSFET. Again, low temperature processing techniques should be used to minimize diffusion of P-type buried layers 75 and 65.

In FIG. 7E the HV-IGFET device is shown completed by the addition of an inter-level dielectric layer 90 (e.g., a low-temperature oxide), etching of contact openings, followed by deposition and patterning of a conductive layer (e.g., aluminum or copper alloy) to form respective drain and source electrodes 91 and 92. Subsequent deposition and patterning of a passivation layer (e.g., silicon nitride) may also be included in the process.

Figure 8:
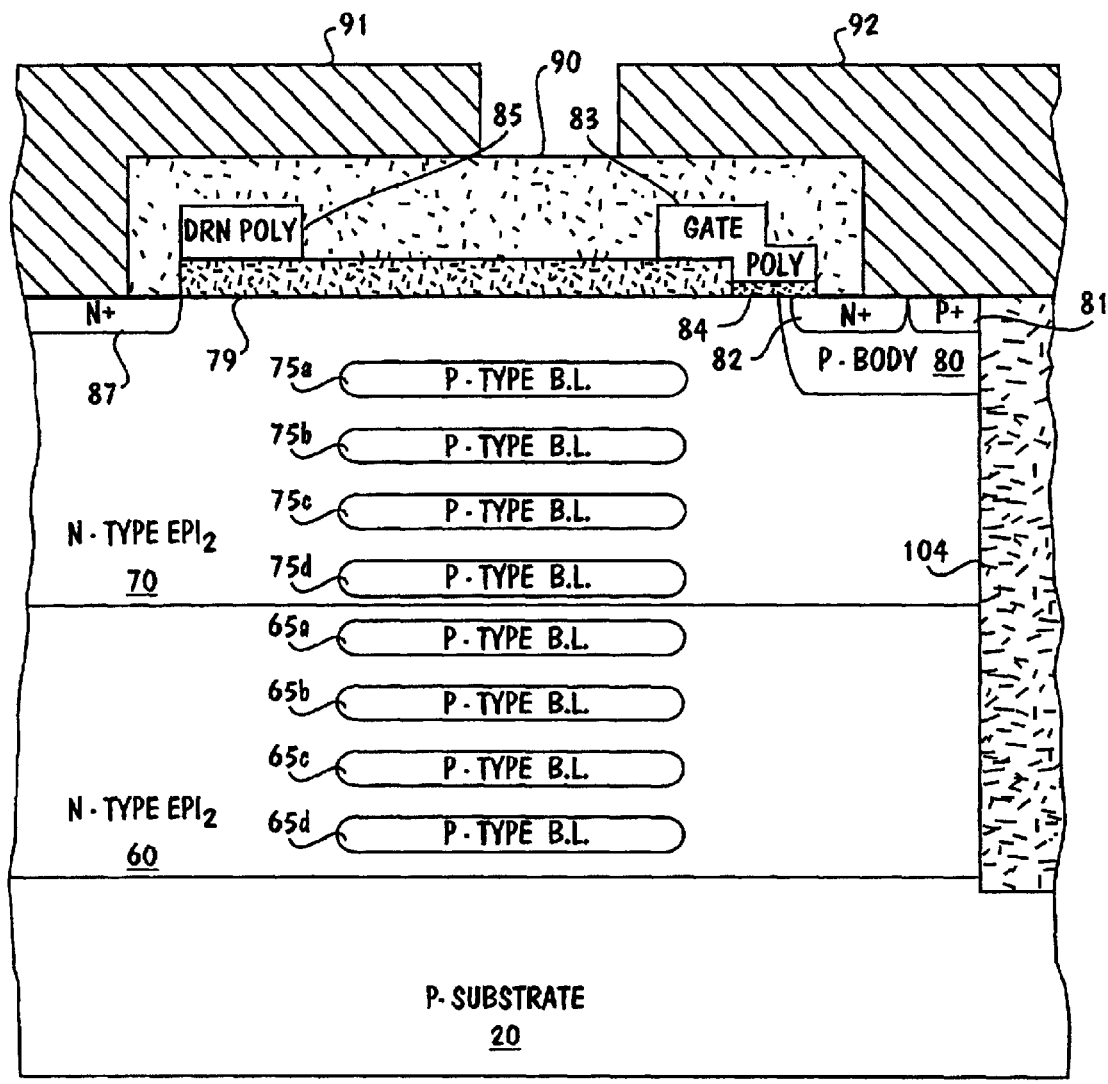
FIG. 8 is a cross-sectional side view of a HVFET according to another alternative embodiment of the present invention.

FIG. 8 illustrates another alternative embodiment of the present invention in which the formation of the PB' and PB" layers is obviated by the formation of a dielectric trench isolation region 102 that extends through epitaxial layers 70 and 60. The method of forming the device of FIG. 8 is similar to that of FIG. 7E, except that there is no need for a second masking layer (with different thickness) at each of the high-energy implantation steps. Trench isolation region 102 may be formed after formation of epitaxial layers 60 & 70 utilizing ordinary trench and refill processing techniques. It is further appreciated that isolation region 102 may also comprise a sandwich of multiple layers, e.g., oxide/polysilicon/oxide, in accordance with known trench isolation techniques.

Figure 9:
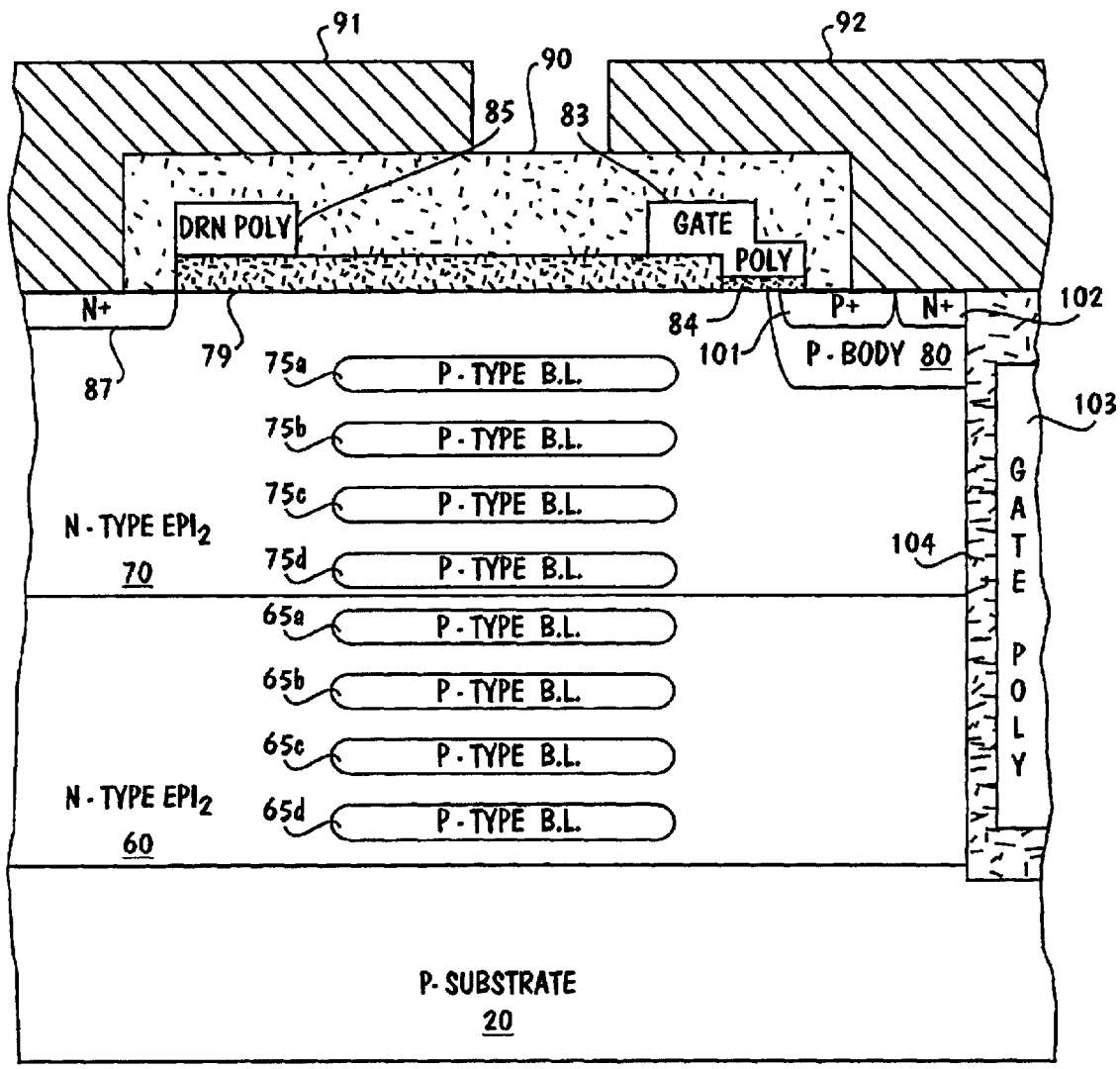
FIG. 9 is a cross-sectional side view of a HVFET according to yet another alternative embodiment of the present invention.

FIG. 9 shows yet another alternative embodiment of the present invention in which a trench gate structure is constructed rather than a planar MOS gate structure, as shown in FIGS. 7 & 8. The trench gate structure comprises a gate member 103 that is insulated from epitaxial layers 60 and 70 by dielectric layer 104. Gate member 103 may be polysilicon, silicide, or other conductive material. Although dielectric layer 104 is shown as having a constant thickness in this example, this layer may also be formed with varying thickness. It may be advantageous, for example, for dielectric layer 104 to be thicker near the bottom of the trench.

Note that in this embodiment the location of the P+ and N+ regions 101 and 102 in body region 80 is reversed from the previous embodiments. That is, N+ source region 102 is disposed adjacent the trench gate structure such that a vertically oriented conducting channel is formed through body region 80. In this embodiment, contact to gate member 103 may be made periodically in the third dimension (i.e., into the page).

Figure 10A:
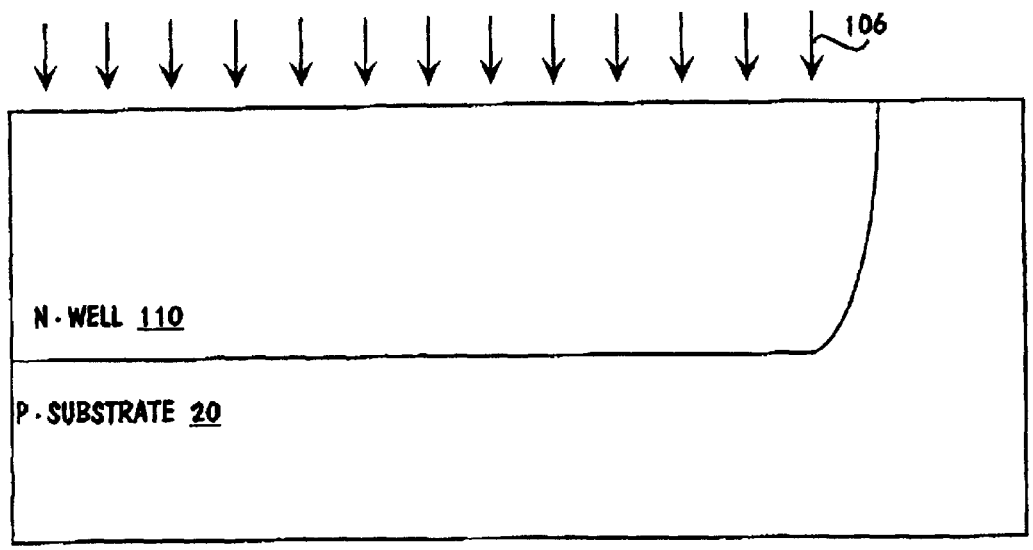
FIGS. 10A–10G are cross-sectional side views illustrating the fabrication of a high-voltage, field-effect transistor (HVFET) device structure in accordance with another alternative embodiment of the present invention.
Figure 10B:
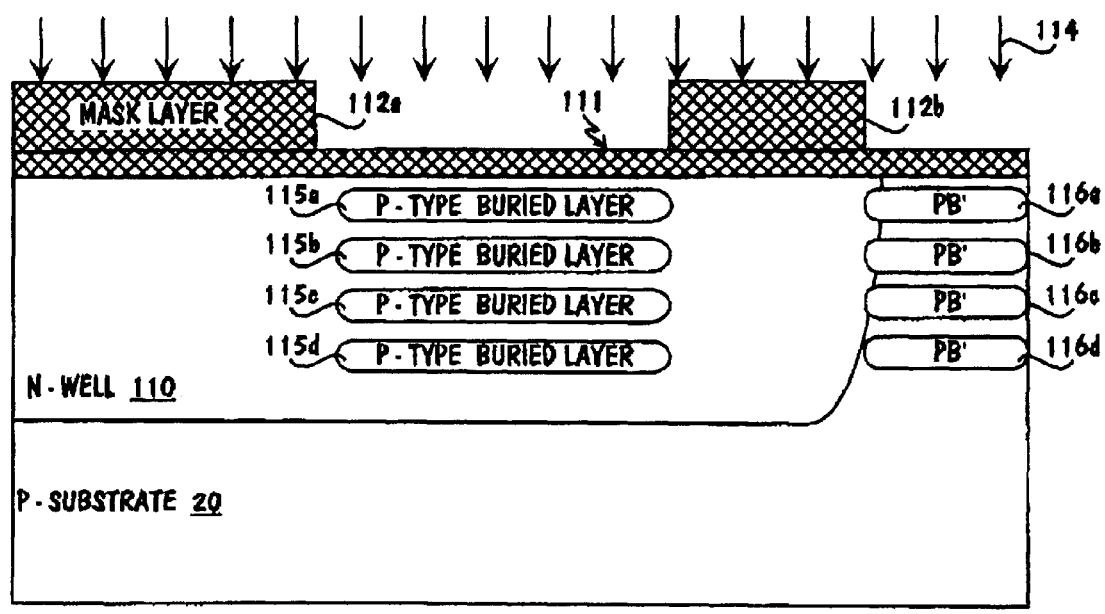
Figure 10C:
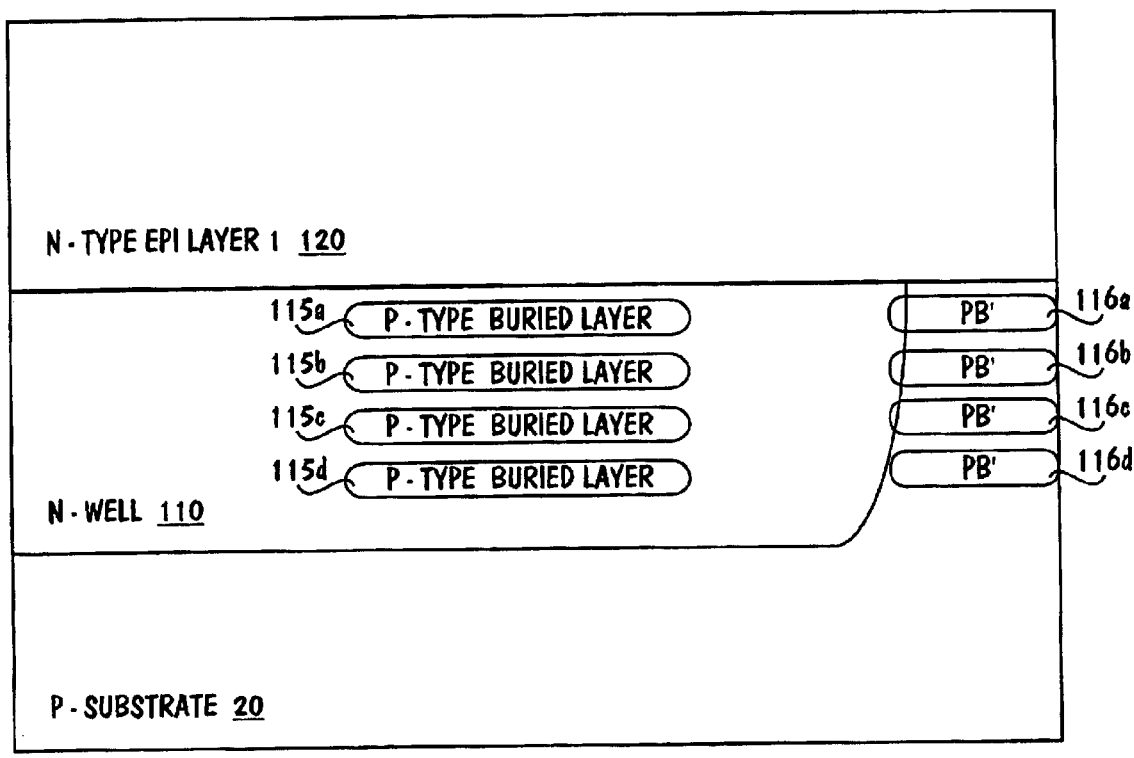
Figure 10D:
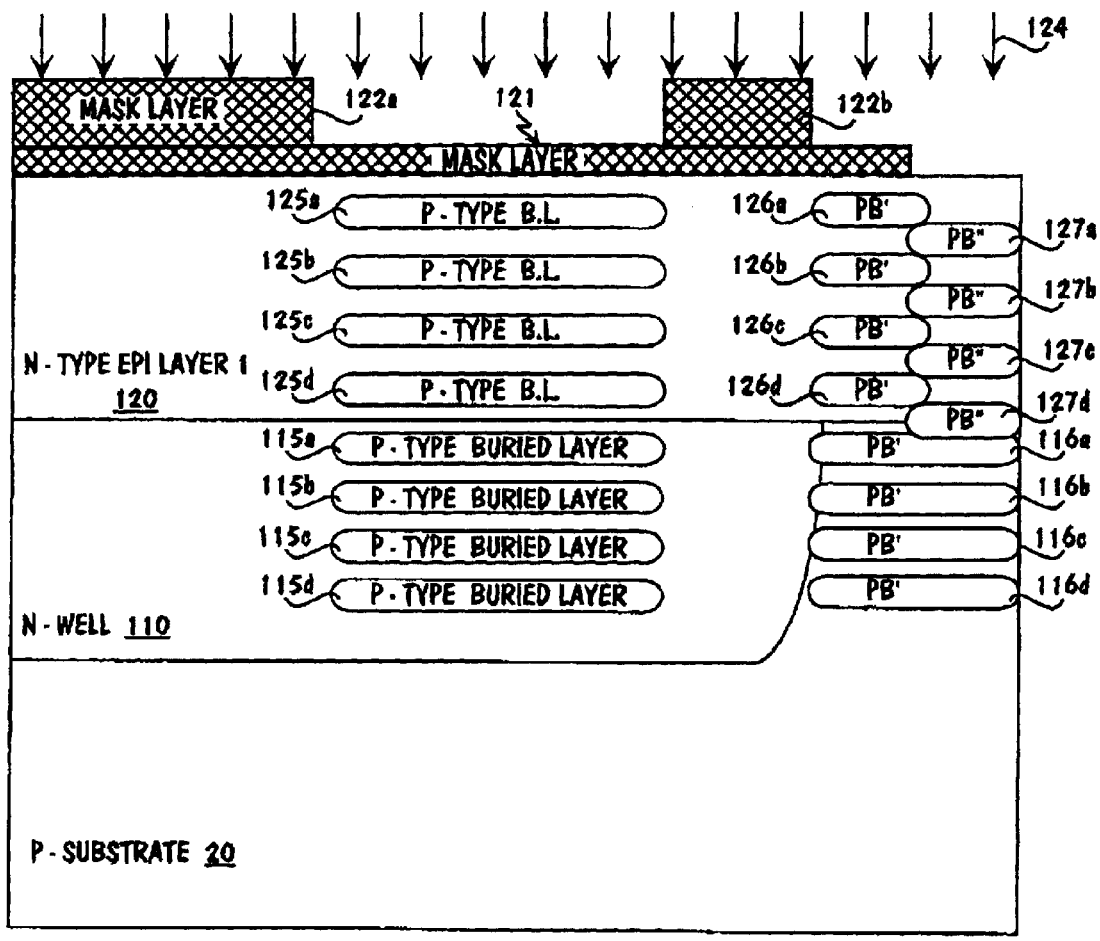

FIGS. 10A–10G are cross-sectional side views illustrating the fabrication of still another embodiment of the present invention. In this embodiment, instead of a first epitaxial layer, an N-well 110 is formed in a P-substrate 20 by ion implantation 106, as shown in FIG. 10A. Masking layers 111 and 112 are then utilized with multiple ion implantations 114 to form a first set of P-type buried layers 115a–115d in N-well 110 together with corresponding PB' layers 116a–116d in an adjacent region of P-substrate 20 (see FIG. 10B). An N-type epitaxial layer (Epi$_1$) 120 is then formed over this structure (see FIG. 10C).

Masking layers 121 and 122 are formed using conventional photolithographic techniques and multiple ion implantations 124 are performed to create a second set of P-type buried layers 125a–125d in epitaxial layer 120. The same ion implantations 124 used to form buried layers 125 may also be used to produce PB' and PB" buried layers 126 and 127, respectively, in the same manner as described for the previous embodiments. In this case, PB' layers 126a–126d merge with PB" layers 127a–127d to form a continuous P-type region.

Figure 10E:
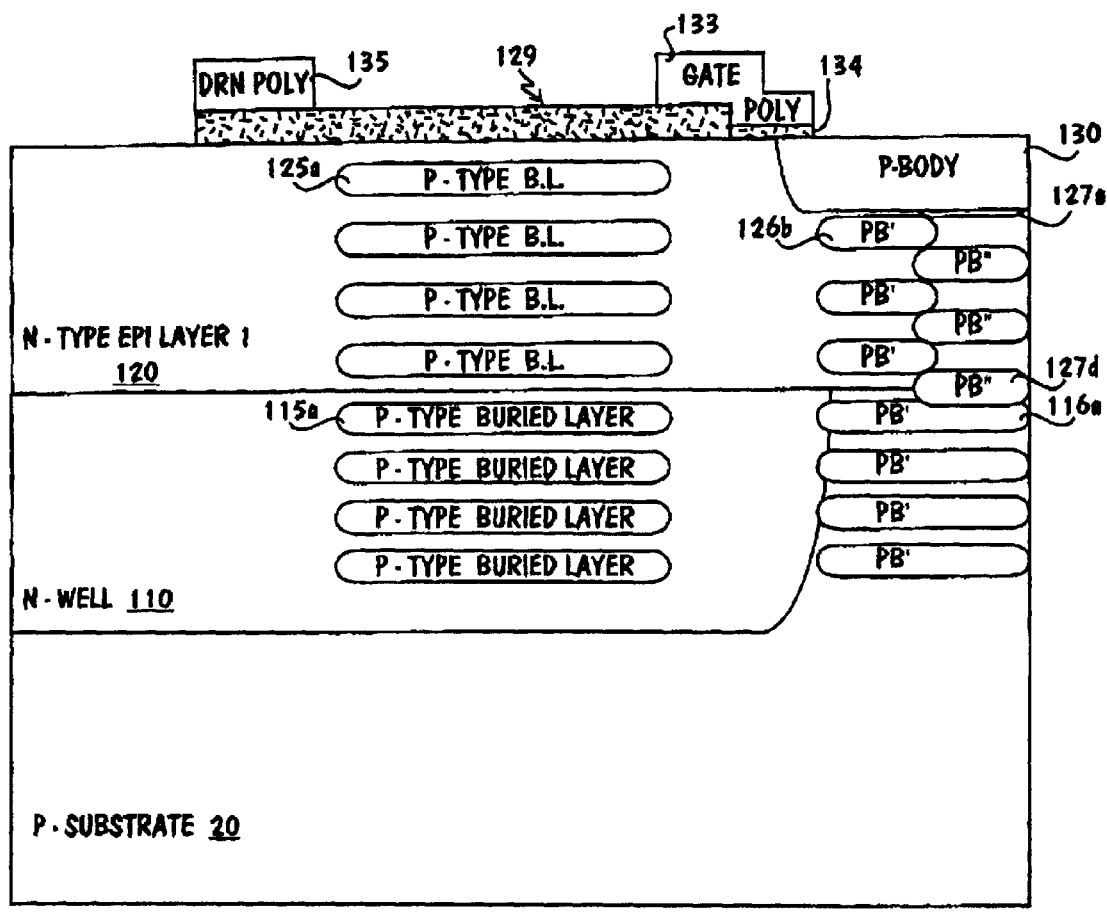
Figure 10F:
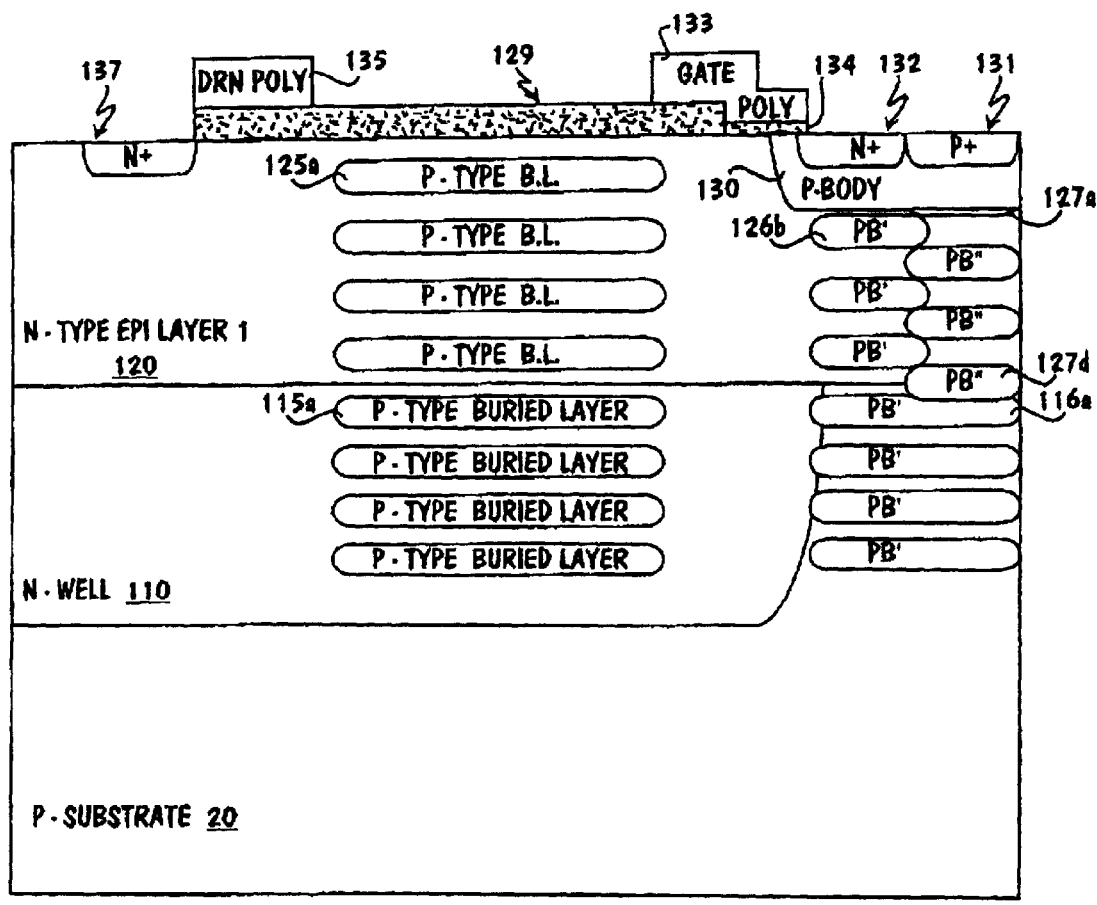
Figure 10G:
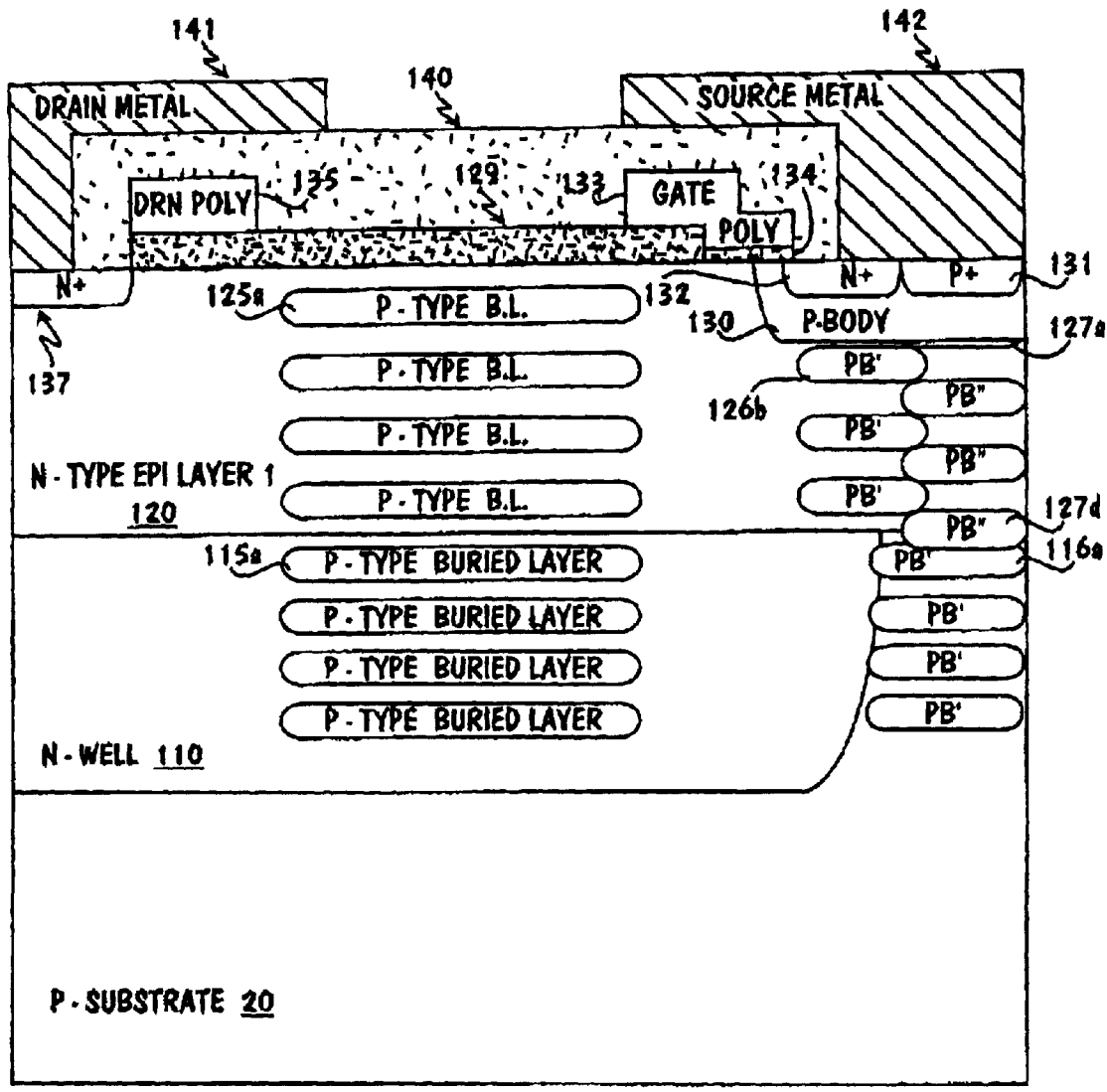

FIG. 10E shows the device after formation of P-body region 130 in epitaxial layer 120. Also shown are field oxide 129, gate oxide 134, gate member 133, and drain field plate member 135 formed above epitaxial layer 120. In FIG. 10F the respective N+ source and drain regions 132 & 137 have been formed, along with an optional P+ region 131 in body region 130. FIG. 10G shows the device essentially complete following formation of an inter-level dielectric layer 140 with drain and source electrodes 141 & 142 contacting the corresponding diffusion regions.

Figure 11:
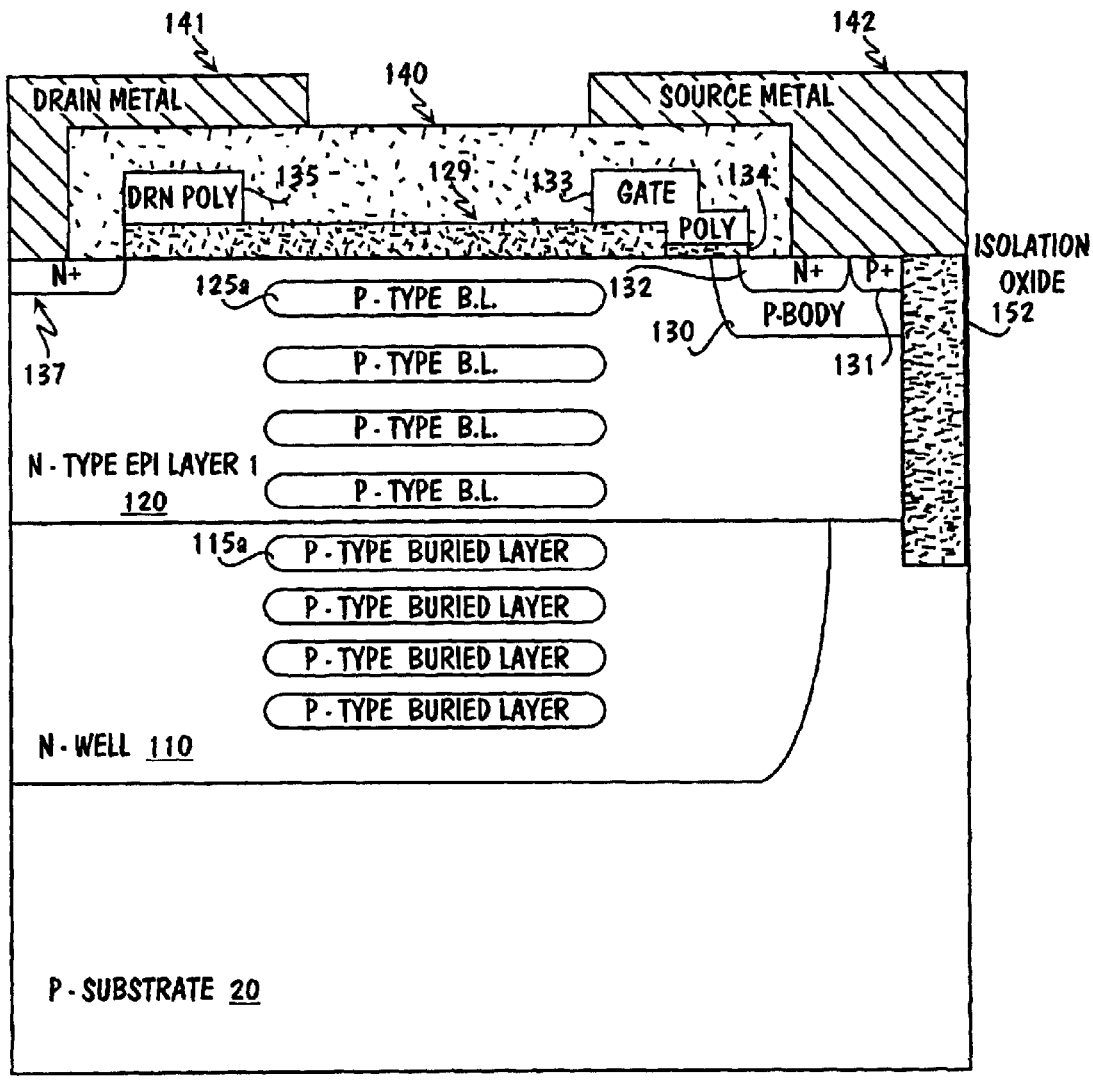
FIG. 11 is a cross-sectional side view of a HVFET according to a further alternative embodiment of the present invention.
Figure 12:
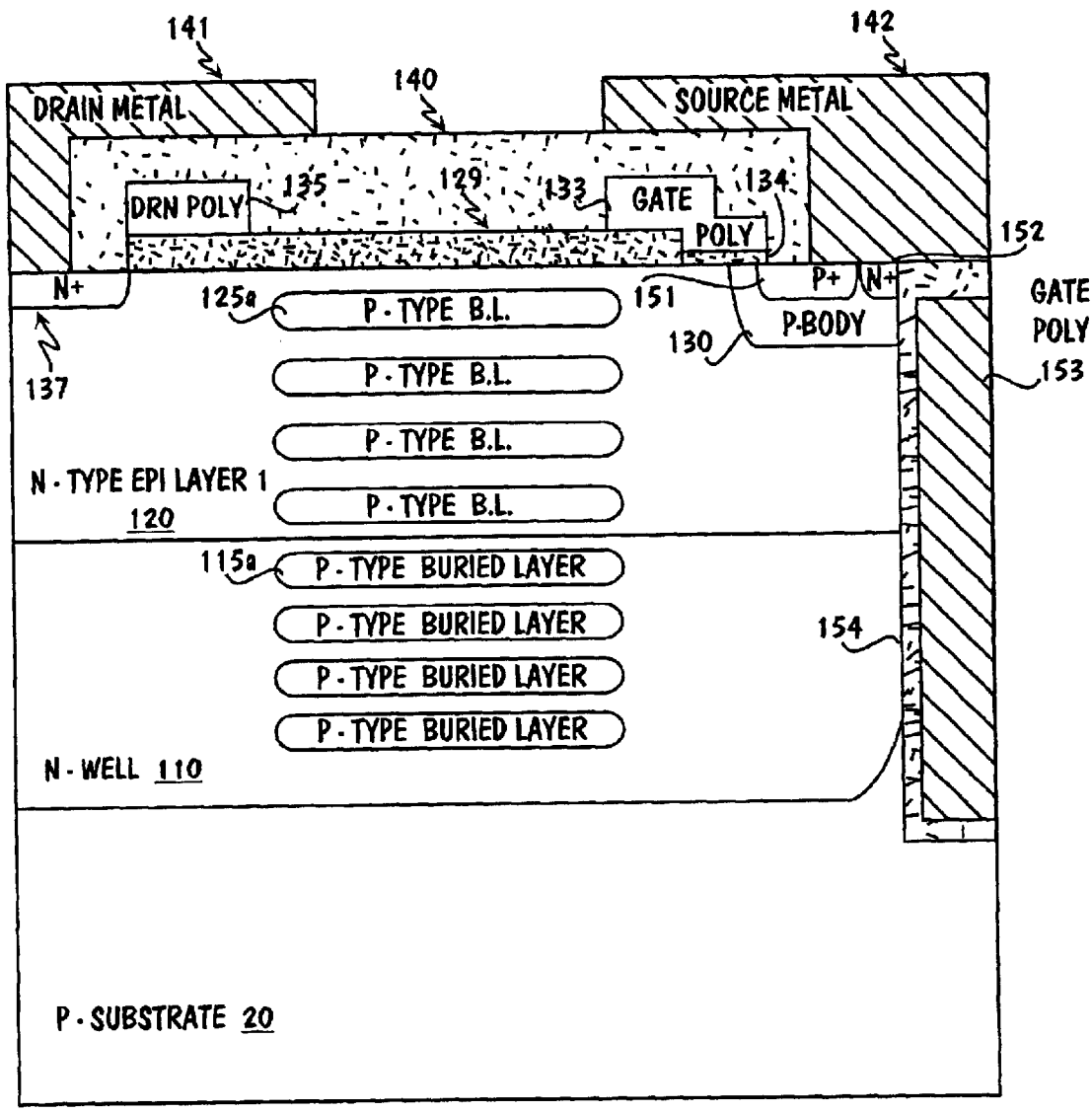
FIG. 12 is a cross-sectional side view of a HVFET according to still another alternative embodiment of the present invention.

The embodiment of FIG. 11 illustrates the device structure of FIG. 10E, except that the optional PB' layers 116 & 126 and PB" layers 127 are replaced with a trench isolation region 152 that extends through epitaxial layer 120. FIG. 12 shows yet another embodiment, which employs a trench, gate structure comprising gate polysilicon member 153 insulated from N-well 110 and epitaxial layer 120 by dielectric layer 154. Here again, note that N+ source region 152 is disposed in body region 130 adjacent dielectric layer 154, with optional P+ region 151 being disposed on an opposite side of N+ source region 152.

It should be understood that although the present invention has been described in conjunction with specific embodiments, numerous modifications and alterations are well within the scope of the present invention. Accordingly, the specification and drawings are to be regarded in an illustrative rather than a restrictive sense.

I claim:

1. A high-voltage field-effect transistor (HVFET) comprising:
   a first buried layer of a second conductivity type disposed in a first epitaxial layer of a first conductivity type;
   a second buried layer of the second conductivity type disposed in a second epitaxial layer of the first conductivity type, the one or more first and second buried layers being spaced vertically apart in a substantially parallel configuration such that a JFET conduction channel of the first conductivity type is formed between the first and second buried layers;
   a drain region of the first conductivity type disposed in the second epitaxial layer;
   a body region of the second conductivity type disposed in the second epitaxial layer;
   a source region of the first conductivity type disposed in the body region; and
   an insulated gate member disposed adjacent to the body region; and
   wherein the first epitaxial layer is formed on a substrate of the second conductivity type.

2. The HVFET of claim 1 wherein the first buried layer is spaced apart from an upper surface of the substrate.

3. A high-voltage field-effect transistor (HVFET) comprising;
   a first buried layer of a second conductivity type disposed in a first epitaxial layer of a first conductivity type;
   a second buried layer of the second conductivity type disposed in a second epitaxial layer of the first conductivity type, the first and second buried layers being spaced vertically apart in a substantially parallel configuration such that a JFET conduction channel of the first conductivity type is formed between the first and second buried layers;
   a drain region of the first conductivity type disposed in the second epitaxial layer;
   a body region of the second conductivity type disposed in the second epitaxial layer;
   a source region of the first conductivity type disposed in the body region; and
   an insulated gate member disposed adjacent to the body region,
   wherein the insulated gate member comprises a trench gate structure.

4. The HVFET of claim 1 further comprising an isolation dielectric region that extends vertically from the upper surface of the second epitaxial layer to the substrate.

5. A high-voltage field-effect transistor (HVFET) comprising:
   a well region of a first conductivity disposed in a substrate of a second conductivity type;
   a first buried layer of the second conductivity type disposed in the well region;
   an epitaxial layer of the first conductivity type formed on the substrate;
   a second buried layer of the second conductivity type disposed in the epitaxial layer, the first and second buried layers being spaced vertically apart in a substantially parallel configuration such that a JFET conduction channel of the first conductivity type is formed between the first and second buried layers;
   a drain region of the first conductivity type disposed in the epitaxial layer;
   a body region of the second conductivity type disposed in the epitaxial layer;
   a source region of the first conductivity type disposed in the body region; and
   an insulated gate member disposed adjacent to the body region.

6. The HVFET of claim 5 wherein the first buried layer is spaced apart from the substrate.

7. The HVFET of claim 5 wherein the second buried layer is spaced apart from the upper surface of the epitaxial layer.

8. The HVFET of claim 5 wherein the first conductivity type is N-type and the second conductivity type is P-type.

9. The HVFET of claim 5 wherein the insulated gate member comprises a trench gate structure.

10. The HVFET of claim 5 wherein the insulated gate member comprises a planar gate structure.

11. The HVFET of claim 5 further comprising an isolation region of the second conductivity type that extends vertically from the body region to the substrate.

12. The HVFET of claim 5 further comprising:
   a drain electrode electrically connected to the drain region;
   a source electrode electrically connected to the source region.

13. The HVFET of claim 5 further comprising an isolation dielectric region disposed adjacent the body region and extending vertically from the upper surface of the epitaxial layer to the substrate.

14. A high-voltage field-effect transistor (HVFET) comprising:
   a substrate of a second conductivity type;
   a first epitaxial layer of a first conductivity type disposed on the substrate;
   a first plurality of buried layers of the second conductivity type disposed in the first epitaxial layer such that a first plurality of JFET conduction channels is formed in the first epitaxial layer;
   a second epitaxial layer of the first conductivity type;
   a second plurality of buried layers of the second conductivity type disposed in the second epitaxial layer such that a second plurality of JFET conduction channels is formed in the second epitaxial layer;
   a drain region of the first conductivity type disposed in the second epitaxial layer;
   a body region of the second conductivity type disposed in the second epitaxial layer;
   a source region of the first conductivity type disposed in the body region; and
   an insulated gate member disposed adjacent to the body region.

15. The HVFET of claim 14 wherein a lowermost one of the first plurality of buried layers is spaced apart from the substrate.

16. The HVFET of claim 14 wherein a lowermost one of the second plurality of buried layers is spaced apart from the upper surface of the first epitaxial layer.

17. The HVFET of claim 14 wherein the first conductivity type is N-type and the second conductivity type is P-type.

18. The HVFET of claim 14 wherein the insulated gate member comprises a trench gate structure.

19. The HVFET of claim 14 wherein the insulated gate member comprises a planar gate structure.

20. The HVFET of claim 14 further comprising an isolation region of the second conductivity type that extends vertically from the body region to the substrate.

21. The HVFET of claim 14 further comprising:
   a drain electrode electrically connected to the drain region;
   a source electrode electrically connected to the source region.

22. The HVFET of claim 14 further comprising an isolation dielectric region disposed adjacent the body region and extending vertically from the upper surface of the second epitaxial layer to the substrate.

23. The HVFET of claim 14 wherein the second plurality of buried layers is spaced-apart from the body region.

24. A high-voltage field-effect transistor (HVFET) comprising:
   a well region of a first conductivity type disposed in a substrate of a second conductivity type;
   a first plurality of buried layers of a second conductivity type disposed within the well region such that a first plurality of JFET conduction channels is formed in the well region;
   an epitaxial layer of the first conductivity type;
   a second plurality of buried layers of the second conductivity type disposed in the epitaxial layer such that a second plurality of JFET conduction channels is formed in the epitaxial layer;
   a drain region of the first conductivity type disposed in the epitaxial layer;
   a body region of the second conductivity type disposed in the epitaxial layer;
   a source region of the first conductivity type disposed in the body region; and
   an insulated gate member disposed adjacent to the body region.

25. The HVFET of claim 24 wherein a lowermost one of the first plurality of buried layers is spaced apart from the substrate.

26. The HVFET of claim 24 wherein a lowermost one of the second plurality of buried layers is spaced apart from the upper surface of the substrate.

27. The HVFET of claim 24 wherein the first conductivity type is N-type and the second conductivity type is P-type.

28. The HVFET of claim 24 wherein the insulated gate member comprises a trench gate structure.

29. The HVFET of claim 24 wherein the insulated gate member comprises a planar gate structure.

30. The HVFET of claim 24 further comprising an isolation region of the second conductivity type that extends vertically from the body region to the substrate.

31. The HVFET of claim 24 further comprising:
   a drain electrode electrically connected to the drain region;
   a source electrode electrically connected to the source region.

32. The HVFET of claim 24 further comprising an isolation dielectric region disposed adjacent the body region and extending vertically from the upper surface of the epitaxial layer to the substrate.

33. An extended drain region of a high-voltage field-effect transistor (HVFET) comprising:
   a first epitaxial layer of a first conductivity type disposed on a substrate of a second conductivity type;
   one or more first buried layers of the second conductivity type disposed in the first epitaxial layer;
   one or more second buried layers of the second conductivity type disposed in a second epitaxial layer of the first conductivity type, the one or more first and the one or more second buried layers being spaced vertically apart in a substantially parallel configuration so as to form one or more JFET conduction channels of the first conductivity type.

34. The extended drain region of claim 33 wherein the one or more first buried layers are spaced apart from an upper surface of the substrate.

35. The extended drain region of claim 33 wherein the one or more second buried layers are spaced apart from the upper surface of the second epitaxial layer.

36. The extended drain region of claim 33 wherein the first conductivity type is N-type and the second conductivity type is P-type.

37. An extended drain region of a high-voltage field-effect transistor (HVFET) comprising:

a well region of a first conductivity disposed in a substrate of a second conductivity type;

one or more first buried layers of the second conductivity type disposed in the well region;

an epitaxial layer of the first conductivity type formed on the substrate layer;

one or more second buried layers of the second conductivity type disposed in the epitaxial layer, the one or more first and the one or more second buried layers being spaced vertically apart in a substantially parallel configuration so as to form one or more JFET conduction channels of the first conductivity type.

38. The HVFET of claim 37 wherein the one or more first buried layers are spaced apart from the substrate.

39. The HVFET of claim 37 wherein the one or more second buried layers are spaced apart from the upper surface of the epitaxial layer.

40. The HVFET of claim 37 wherein the first conductivity type is N-type and the second conductivity type is P-type.

* * * * *